United States Patent
Toyofuku

(10) Patent No.: US 11,337,285 B2
(45) Date of Patent: May 17, 2022

(54) OLED DRIVING SYSTEM AND OLED DRIVING METHOD

(71) Applicant: CCS Inc., Kyoto (JP)

(72) Inventor: Toshiyuki Toyofuku, Kyoto (JP)

(73) Assignee: CCS INC., Kyoto (JP)

(*) Notice: Subject to any disclaimer, the term of this patent is extended or adjusted under 35 U.S.C. 154(b) by 0 days.

(21) Appl. No.: 17/286,679

(22) PCT Filed: Oct. 23, 2019

(86) PCT No.: PCT/JP2019/041498
§ 371 (c)(1),
(2) Date: Apr. 19, 2021

(87) PCT Pub. No.: WO2020/085369
PCT Pub. Date: Apr. 30, 2020

(65) Prior Publication Data
US 2021/0378072 A1    Dec. 2, 2021

(30) Foreign Application Priority Data

Oct. 26, 2018 (JP) .............................. JP2018-201446

(51) Int. Cl.
*H05B 45/60* (2022.01)
*H05B 45/14* (2020.01)
*H05B 45/325* (2020.01)

(52) U.S. Cl.
CPC ............. *H05B 45/60* (2020.01); *H05B 45/14* (2020.01); *H05B 45/325* (2020.01)

(58) Field of Classification Search
CPC ...... H05B 47/10; H05B 47/105; H05B 47/16; H05B 45/60; H05B 45/14; H05B 45/325; H05B 45/56
See application file for complete search history.

(56) References Cited

U.S. PATENT DOCUMENTS

| 8,441,184 B2* | 5/2013 | Sakata | ................... H05B 45/60 313/504 |
| 2010/0271802 A1* | 10/2010 | Recker | ................... H05B 47/19 362/20 |

(Continued)

FOREIGN PATENT DOCUMENTS

| JP | 2003302939 A | 10/2003 |
| JP | 5814924 B2 | 10/2015 |

(Continued)

*Primary Examiner* — Abdullah A Riyami
*Assistant Examiner* — Syed M Kaiser
(74) *Attorney, Agent, or Firm* — Alleman Hall Creasman & Tuttle LLP

(57) ABSTRACT

An OLED driving system and an OLED driving method according to the present invention include: storing usage information representing an accumulated actual usage time of an OLED lighting device with respect to each of a plurality of electric current ranges different from one another in a usage information storage part; updating the accumulated actual usage time by adding an actual usage time of the OLED lighting device to the accumulated actual usage time stored in the usage information storage part and represented as the usage information with respect to a specific electric current range corresponding to an electric current value of an electric power output to the OLED lighting device; and storing the updated accumulated actual usage time.

14 Claims, 6 Drawing Sheets

(56) References Cited

U.S. PATENT DOCUMENTS

| | | | |
|---|---|---|---|
| 2011/0089855 A1 | 4/2011 | Roberts et al. | |
| 2012/0080944 A1* | 4/2012 | Recker | H05B 47/11 |
| | | | 307/25 |
| 2014/0252988 A1* | 9/2014 | Azizi | H05B 45/14 |
| | | | 315/307 |
| 2016/0150623 A1* | 5/2016 | Uemura | H05B 45/60 |
| | | | 399/220 |
| 2017/0325301 A1* | 11/2017 | Maa | H05B 47/20 |

FOREIGN PATENT DOCUMENTS

| | | | | |
|---|---|---|---|---|
| JP | 2016100548 A | * | 5/2016 | ............ H05B 45/30 |
| JP | 2016100548 A | | 5/2016 | |
| JP | 2016135555 A | * | 7/2016 | |
| JP | 2016135555 A | | 7/2016 | |

* cited by examiner

FIG. 2

UTa

| ELECTRIC CURRENT RANGE (mA) | ACCUMULATED ACTUAL USAGE TIME |
|---|---|
| $i1 \leq I \leq i2$ | T11 |
| $i2 < I \leq i3$ | T12 |
| $i3 < I \leq i4$ | T13 |
| $i4 < I \leq i5$ | T14 |
| $i5 < I \leq i6$ | T15 |
| $i6 < I \leq i7$ | T16 |

2611  2612

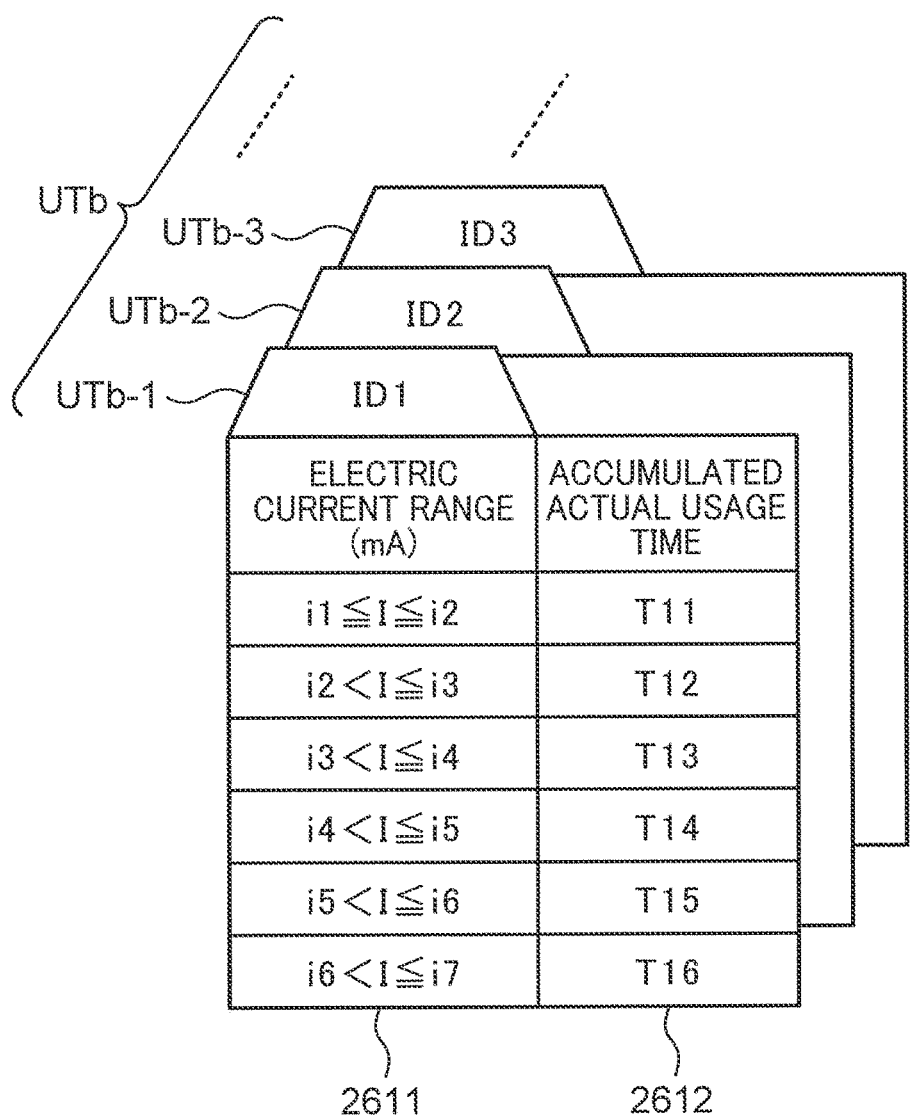

OLED DRIVING SYSTEM AND OLED DRIVING METHOD

TECHNICAL FIELD

The present invention relates to an OLED driving system and an OLED driving method for driving an OLED lighting device.

BACKGROUND ART

Organic light emitting diodes (OLEDs), each called an organic electroluminescence (organic EL) as well, are relatively thin and have light weights with low power consumptions. In this respect, the OLEDs have been researched and developed for applications to, for example, display devices and lighting devices.

Meanwhile, light emitting diode (LED) lighting devices have been conventionally adopted as lighting devices each for a machine vision of processing an image of a workpiece target taken by an image sensor having a plurality of photoelectronic conversion elements in one-dimensionally or two-dimensionally arrayed arrangement in accordance with a predetermined aim, e.g., an inspection and a target recognition. A system employing the machine vision generally includes a controlling device which controls a lighting device to permit an image taking device to take a better image. The controlling device controls the lighting device based on, for example, the image taken by the image taking device so that a radiance of the lighting device or an illuminance of a target to be illuminated has a predetermined value. When an inconvenience occurs in the system, it is necessary to determine whether the inconvenience is caused by the image taking device, the lighting device, or the controlling device. Such determination needs a lot of operations or steps. A proposed approach is to first inspect whether the inconvenience is caused by the lighting device. For instance, a technology disclosed in Patent Literature 1 is adoptable for the inspection.

The technology disclosed in Patent Literature 1 includes: driving a solid-state light source of an LED, an OLED, or the like at a predetermined test electric current level of a power source by selecting a test mode; receiving a voltage feedback value from the power source; and estimating, from the voltage feedback value, a deterioration of the solid-state light source by using volt per amp performance characteristics representing a relation between a time including an end-of-life time and a voltage value. The technology disclosed in Patent Literature 1 makes a determination that the inconvenience is caused by the lighting device when the lighting device is estimated to deteriorate, and makes a determination that the inconvenience is caused by at least one of the image taking device and the controlling device when the lighting device is estimated not to deteriorate and has no cause for the inconvenience.

Meanwhile, an OLED basically experiences a reduction or deterioration in the radiance depending on an amount of an electric current applied thereto. Thus, use of the volt characteristics disclosed in Patent Literature 1 may lead to an inaccurate estimation concerning a deterioration.

CITATION LIST

Patent Literature

Patent Literature 1: Japanese Patent Publication No. 5814924

SUMMARY OF INVENTION

The present invention has been accomplished in view of the aforementioned drawbacks, and an object of the present invention is to provide an OLED driving system and an OLED driving method for more accurately estimating a deterioration.

An OLED driving system and an OLED driving method according to the present invention include: storing usage information representing an accumulated actual usage time of an OLED lighting device with respect to each of a plurality of electric current ranges different from one another in a usage information storage part; updating the accumulated actual usage time by adding an actual usage time of the OLED lighting device to the accumulated actual usage time stored in the usage information storage part and represented as the usage information with respect to a specific electric current range corresponding to an electric current value of an electric power output to the OLED lighting device; and storing the updated usage accumulated actual usage time.

The object, features, and advantages of the present invention will be further clarified by the following detailed description and the accompanying drawings.

BRIEF DESCRIPTION OF DRAWINGS

FIG. 2 shows a configuration of a usage information table stored in a usage information storage part included in the OLED driving system.

FIG. 6 shows a modified usage information table stored in a usage information storage part in each of the first and the second modified embodiments.

DESCRIPTION OF EMBODIMENTS

Figure 1:
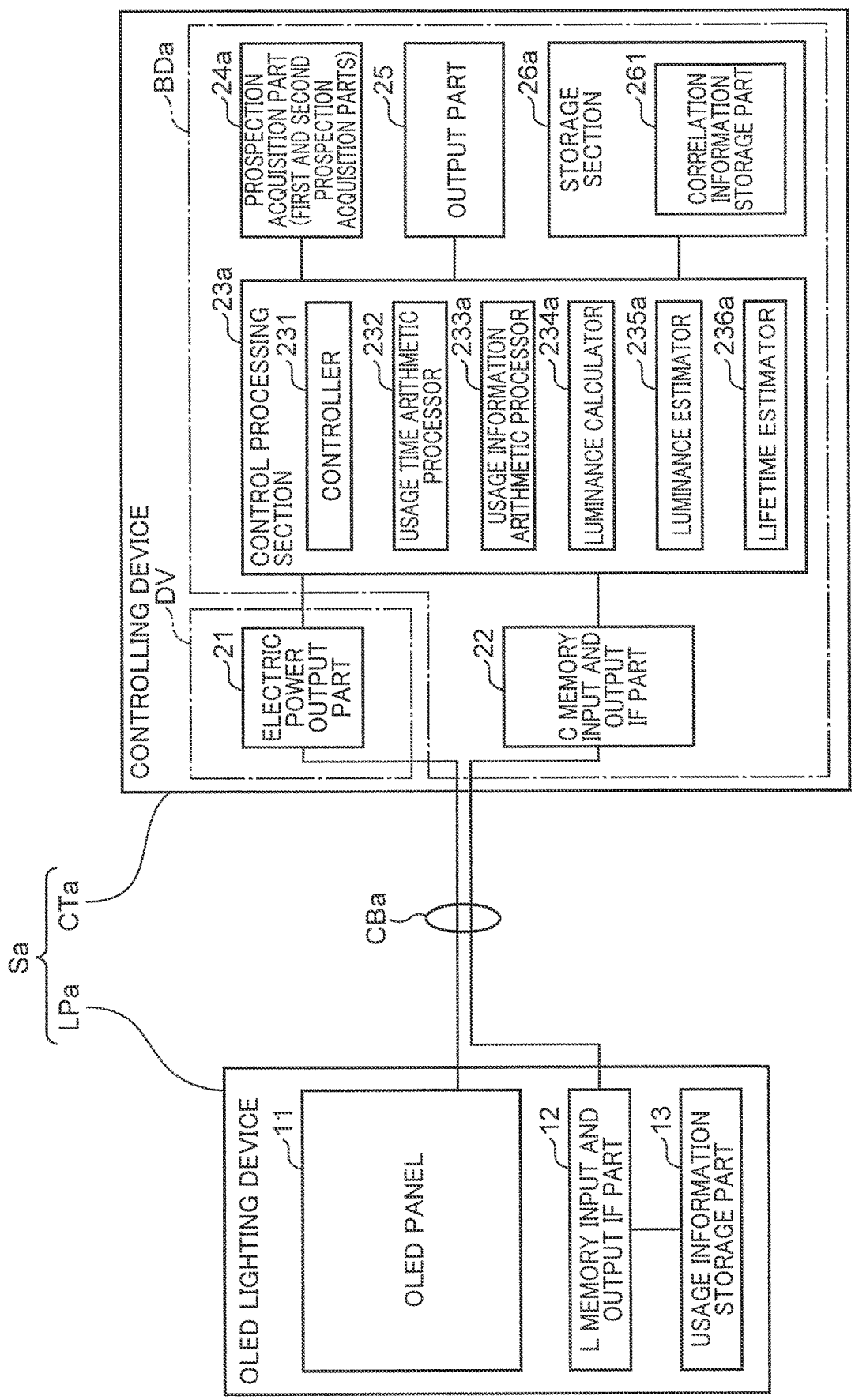
FIG. 1 is a block diagram showing configurations of an OLED driving system, an OLED lighting device, and a controlling device according to an embodiment.

Hereinafter, one or more embodiments of the present invention will be described with reference to the accompanying drawings. However, the scope of the invention should not be limited to the disclosed embodiments. Elements denoted by the same reference numerals in the drawings have the same configuration and, therefore, repeated descriptions will be appropriately omitted. In the present specification, elements are denoted by a same reference numeral when being referred to collectively, and are denoted by a same reference numeral accompanied by a different respective reference character when being referred to individually.

Figure 3:
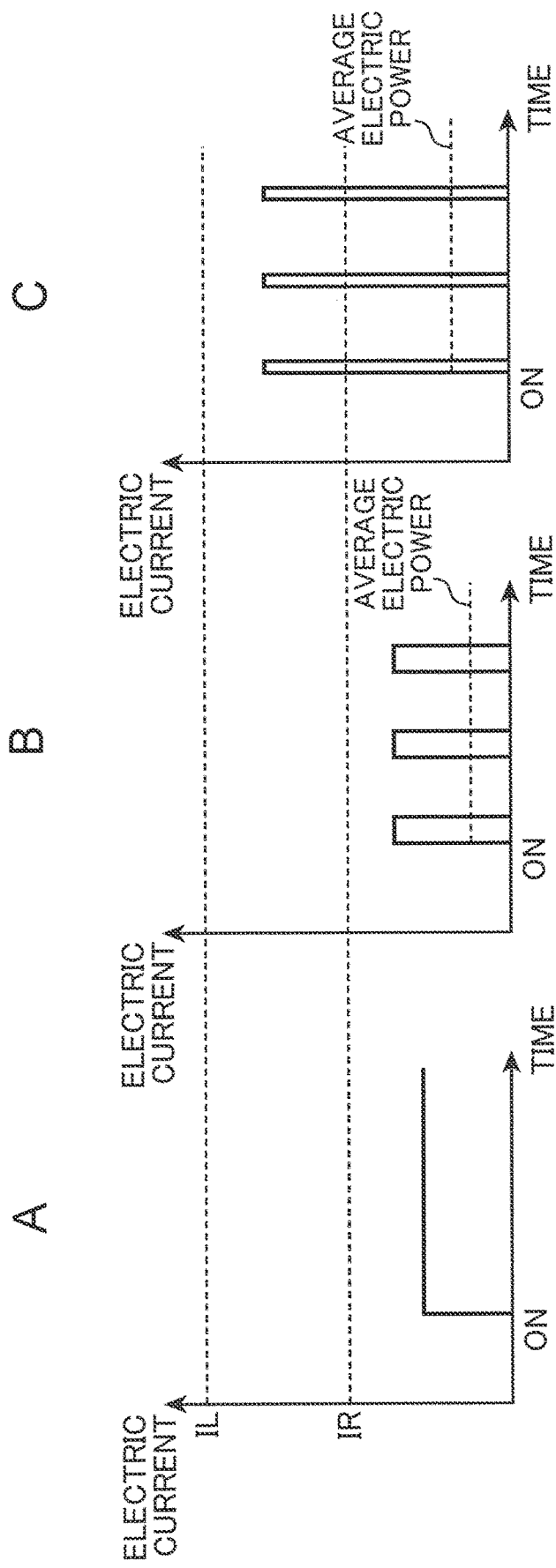
FIG. 3 includes graphs each explaining a drive mode of the OLED lighting device.

FIG. 1 is a block diagram showing configurations of an OLED driving system, an OLED lighting device, and a controlling device according to an embodiment. FIG. 2 shows a configuration of a usage information table stored in a usage information storage part included in the OLED driving system. FIG. 3 includes graphs each explaining a drive mode of the OLED lighting device. FIG. 3 at A shows an electric current waveform at a continuous application drive mode. FIG. 3 at B shows an electric current waveform at a normal pulse application drive mode. FIG. 3 at C shows an electric current waveform at an overdrive pulse application drive mode. A horizontal axis in each of A to C of FIG. 3 represents a time (elapsed time), and a vertical axis therein represents an electric current (an electric current intensity).

An OLED driving system according to an embodiment is a system for driving an OLED lighting device. The OLED driving system includes: a usage information storage part which stores usage information representing an accumulated actual usage time of the OLED lighting device with respect to each of a plurality of electric current ranges different from one another; an electric power output part which outputs an electric power at a changeable electric current value to drive the OLED lighting device at a predetermined target luminance; a usage time arithmetic processor which calculates an actual usage time of the OLED lighting device; and a usage information writer which updates the accumulated actual usage time by adding the actual usage time calculated by the usage time arithmetic processor to the accumulated actual usage time stored in the usage information storage part and represented as the usage information with respect to a specific electric current range corresponding to the electric current value of the electric power output from the electric power output part, and causes the usage information storage part to store usage information representing the updated accumulated actual usage time.

An OLED driving system Sa having this configuration includes, for example, an OLED lighting device LPa and a controlling device CTa connected to the OLED lighting device LPa via a cable CBa as shown in FIG. 1. The controlling device CTa supplies an electric power to the OLED lighting device LPa, and transmits and receives predetermined data thereto and therefrom in the embodiment. For these purposes, the cable CBa has a power line for the electric power supply and a communication line for data reading and writing.

The OLED lighting device LPa emits illumination light by using an OLED. As shown in FIG. 1, the OLED lighting device LPa includes, for example, an OLED panel 11, a lighting-side memory input and output interface part (L memory input and output IF part) 12, and a usage information storage part 13. The OLED panel 11, the L memory input and output IF part 12, and the usage information storage part 13 are accommodated in an unillustrated and predetermined casing (first casing or first housing) so that an emitting surface of the OLED panel 11 for the illumination light emission faces outside.

The OLED panel 11 is connected to the power line of the cable CBa and includes an organic light emitting diode (OLED) for emitting light as the illumination light on a plane basis (in two-dimension) after receiving the electric power supply through the power line of the cable CBa. The OLED panel 11, which can have any shape, e.g., a polygonal shape, a circular shape, and other shape, has a rectangular shape in a plan view in the embodiment as shown in FIG. 1. The OLED panel 11 may be in a single color or white depending on its use way. The OLED panel 11 includes a pair of first and second electrodes, and an organic emissive layer therebetween. The OLED panel 11 emits light when the first and the second electrodes receive an electric power supply and electrons and holes in the organic emissive layer recombine. Specifically, for instance, the OLED panel 11 includes: an optical substrate having a sheet shape (in a layer) and made of, for example, resin or glass; a transparent electrode serving as the first electrode formed in a layer (a film shape) on the optical substrate; an organic emissive layer formed in a layer (a film shape) on the transparent electrode; a metal electrode serving as the second electrode formed in a layer (a film shape) on the organic emissive layer; and a cover layer enclosing the transparent electrode, the organic emissive layer, and the metal electrode in cooperation with the optical substrate in such a way as to apply an electric current from outside to the transparent electrode and the metal electrode. Here, multiple organic emissive layers may be provided to increase a light amount.

The L memory input and output IF part 12 is a circuit connected to the communication line of the cable CBa for reading and writing predetermined data from and to the usage information storage part 13, and transmitting and receiving the predetermined data to and from the controlling device CTa. The L memory input and output IF part 12 may be configured to include, for example, a memory reading and writing circuit, a universal serial bus (USB) interface circuit, and a peripheral circuit therearound.

The usage information storage part 13 is a circuit connected to the L memory input and output IF part 12 for storing usage information representing an accumulated actual usage time of the OLED lighting device LPa with respect to each of a plurality of electric current ranges different from one another. The usage information storage part 13 includes, for example, a rewritable and non-volatile storage element, e.g., an electrically erasable programmable read only memory (EEPROM), and a peripheral circuit therearound. In a continuous application driving for driving the OLED lighting device LPa by continuously applying the electric current to the OLED lighting device LPa, the usage information directly represents an accumulated actual usage time representing a value of an accumulated usage time of the OLED lighting device LPa. In a pulse application driving for driving the OLED lighting device LPa by applying a pulsed electric current to the OLED lighting device LPa, the usage information represents: an accumulated actual usage time representing a value obtained by multiplying a pulse width (pulse duration) by a cumulative pulse number; the pulse width (pulse duration) and the cumulative pulse number; an accumulated actual usage time representing a value obtained by accumulating an actual usage time obtained by multiplying a usage time of the OLED lighting device LPa by a duty ratio; or a value of each of the accumulated usage time obtained by accumulating the usage time of the OLED lighting device LPa, and the duty ratio. For instance, the accumulated actual usage time is calculated by multiplying the accumulated usage time by the duty ratio for driving the OLED lighting device LPa at a periodical pulse, e.g., for driving the OLED lighting device LPa under a pulse-width modulation (PWM). As shown in FIG. 3 at A, the continuous application driving (a continuous application drive mode or CW application drive mode) represents a driving way (drive mode) for driving the OLED lighting device LPa by continuously applying the electric current to the OLED lighting device LPa at an electric current value equal to or lower than a rated electric current value IR. The rated electric current value IR is an electric current value guaranteed by a manufacturer of the OLED panel 11 for a stable use of the OLED panel 11 at a predetermined performance or higher. As shown in FIG. 3 at B and FIG. 3 at C, the pulse application driving (a pulse application drive mode) represents another way (drive mode) for driving the OLED lighting device LPa by applying the pulsed electric current to the OLED lighting device LPa. The pulse application driving (pulse application drive mode) includes a normal pulse application driving (normal pulse application drive mode or NP application drive mode) as shown in FIG. 3 at B, and an overdrive pulse application driving (overdrive pulse application drive mode or ODP application drive mode) as shown in FIG. 3 at C. The normal pulse application driving (normal pulse application drive mode or NP application drive mode) permits an application of the pulsed electric current to the OLED lighting device LPa at an electric current value equal to or lower than the rated electric current value IR for a light emission in a way of, for example, flashing or light modulation. The overdrive pulse application driving (overdrive pulse application drive mode or ODP application drive mode) permits an application of the pulsed electric current to the OLED lighting device LPa at an electric current value higher than the rated electric current value IR and equal to or lower than a predetermined overdrive maximal capacity electric current value (OD maximal capacity electric current value) IL for a light emission in a way of, for example, flashing. The OD maximal capacity electric current value IL is set in advance appropriately to fall within a specific range of avoiding a damage to the OLED panel 11 in the application of the pulsed electric current thereto.

The usage information storage part 13 stores the usage information in the form of a table in the embodiment. As shown in FIG. 2, a usage information table UTa which registers the usage information includes, for example, an electric current range field 2611 that registers each of the electric current ranges, and an accumulated actual usage time field 2612 that registers, as the usage information, the accumulated actual usage time with respect to each of the electric current ranges registered in the electric current range field 2611. The usage information table UTa further has a record with respect to each of the electric current ranges. In the example shown in FIG. 2, an upper limit electric current value i5 within a fourth electric current range $i4<I\le i5$ of a fourth raw from the top corresponds to the rated electric current value IR. Besides, an upper limit electric current value i7 within a sixth electric current range $i6<I\le i7$ in a sixth raw from the top corresponds to the OD maximal capacity electric current value IL. The usage information storage part 13 further stores the rated electric current value IR and the OD maximal capacity electric current value IL. Here, the symbols "i1", "i2" . . . , "T11", "T12" . . . and other symbols respectively represent predetermined data (numeric values). In a default state (an initial state), the electric current range field 2611 in the record receives a registration of a numeric value representing each of the electric current ranges, and the accumulated actual usage time field 2612 in the record receives a registration of an initial value "0".

The controlling device CTa controls an emission of the illumination light and a suspension thereof, and a light amount of the illumination light by regulating the electric power supply to the OLED lighting device LPa via the cable CBa. As shown in FIG. 1, the controlling device CTa includes, for example, an electric power output part 21, a controlling-side memory input and output interface part (C memory input and output IF part) 22, a control processing section 23a, a prospection acquisition part 24a, an output part 25, and a storage section 26a.

The electric power output part 21 is a drive circuit connected to the power line of the cable CBa and the control processing section 23a for outputting an electric power at a changeable electric current value in accordance with a control of the control processing section 23a to drive the OLED lighting device LPa at a predetermined target luminance. The electric power output part 21 supplies, for example, the electric power to the OLED panel 11 of the OLED lighting device LPa via the cable CBa at an electric current value corresponding to a target luminance in response to an input of the target luminance from the control processing section 23a. Alternatively, for instance, the electric power output part 21 supplies the electric power to the OLED panel 11 of the OLED lighting device LPa via the cable CBa at a target electric current value corresponding to the target luminance in response to an input of the target electric current value from the control processing section 23a.

The C memory input and output IF part 22 is a circuit connected to the communication line of the cable CBa and the control processing section 23a for transmitting and receiving predetermined data to and from the OLED lighting device LPa in accordance with a control of the control processing section 23a so that the predetermined data is read from and written to the usage information storage part 13 of the OLED lighting device LPa. The C memory input and output IF part 22 may be configured to include, for example, a USB interface circuit and a peripheral circuit therearound.

The prospection acquisition part (each of first and second prospection acquisition parts) 24a is connected to the control processing section 23a for acquiring a prospective accumulated actual usage time of the OLED lighting device with respect to each of the electric current ranges to estimate a luminance value of the OLED lighting device LPa to be described below, and further acquiring a prospective electric current value to estimate an available actual usage time of the OLED lighting device LPa to be described later, in accordance with a control of the control processing section 23a. The prospection acquisition part 24a may be, for example, a communication interface circuit for acquiring, from an external device (e.g., a tablet terminal and a smartphone) via a network, data concerning the prospective accumulated actual usage time with respect to each of the electric current ranges or the prospective electric current value. Alternatively, for instance, the prospection acquisition part 24a may be an input device, e.g., a keyboard and a mouse, for inputting the data concerning the prospective accumulated actual usage time with respect to each of the electric current ranges or the prospective electric current value.

The output part 25 is connected to the control processing section 23a for displaying, in accordance with a control of the control processing section 23a: the data acquired by the prospection acquisition part 24a; and a current luminance value, an estimated luminance value at the prospective accumulated actual usage time, and a lifetime at the prospective electric current value, each calculated in a manner described below. The output part 25 may be, for example, a display device such as a CRT display, a liquid crystal display, and an organic EL display, or a printing device such as a printer.

The storage section 26a is a circuit connected to the control processing section 23a for storing various predetermined programs and various predetermined data in accordance with a control of the control processing section 23a. The various predetermined programs include the following control processing programs: a control program for controlling the respective parts and sections 21, 22, 24a, 25, 26a of the controlling device CTa in accordance with their respective operations; a usage time arithmetic processing program for calculating an actual usage time of the OLED lighting device LPa; a usage information arithmetic processing program for updating an accumulated actual usage time by adding an actual usage time calculated with the usage time arithmetic processing program to the accumulated actual usage time stored in the usage information storage part 13 and represented as the usage information with respect to a specific electric current range corresponding to an electric current value of an electric power output from the electric power output part 21, and causing the usage information storage part 13 to store usage information representing the updated accumulated actual usage time; a luminance calculation program for calculating a luminance value of the OLED lighting device corresponding to the usage information stored in the usage information storage part 13 of the OLED lighting device LPa with respect to each of the electric current ranges by using correlation information to be described later; a luminance estimation program for obtaining, based on a prospective accumulated actual usage time acquired by the prospection acquisition part 24a with respect to each of the electric current ranges, prospective usage information corresponding to the usage information with respect to each of the electric current ranges, and estimating, by using the correlation information, a luminance value of the OLED lighting device LPa corresponding to the usage information stored in the usage information storage part 13 of the OLED lighting device LPa with respect to each of the electric current ranges and corresponding to the obtained prospective usage information with respect to each of the electric current ranges; and a lifetime estimation program for obtaining, based on an available actual usage time representing an actual time until a lifetime luminance value defined as a lifetime of the OLED lighting device LPa and a prospective electric current value acquired by the prospection acquisition part 24a, lifetime usage information corresponding to the usage information with respect to each of the electric current ranges, and calculating the available actual usage time based on the lifetime luminance value, the usage information stored in the usage information storage part 13 with respect to each of the electric current ranges, and the obtained lifetime usage information with respect to each of the electric current ranges, by using the correlation information. The various predetermined data includes the following data: data required for actually executing each of the predetermined programs concerning, for example, the prospective accumulated actual usage time with respect to each of the electric current ranges or the prospective electric current value acquired by the prospection acquisition part 24a, and the lifetime luminance value; and data concerning the luminance value, the estimated luminance value, and the available actual usage time each resulting from the calculation. The storage section 26a includes, for example, a read only memory (ROM) that is a non-volatile storage element and an EEPROM that is a rewritable and non-volatile storage element. The storage section 26a further includes a random-access memory (RAM) serving as a working memory of the control processing section 23a for storing the data obtained during the execution of each of the predetermined programs. Here, the storage section 26a may include a hard disk element having a relatively large storage capacity.

Moreover, the storage section 26a operably includes a correlation information storage part 261 for storing the correlation information. The correlation information represents a correlation between an electric current value and an accumulated actual usage time of the OLED lighting device LPa, and a corresponding luminance value of the OLED lighting device LPa. The correlation information is obtained by way of, for example, statistical processing using a plurality of samples in advance. The correlation information storage part 261 stores the correlation information in the form of, for example, a lookup table or a function expression. An OLED has luminance reduction characteristics depending on an electric current value I per area (A/cm$^2$), an accumulated actual usage time t (second), a temperature T (° C.), and a characteristic value k peculiar to the OLED determined on the basis of, for example, the composition thereof. In the embodiment, the correlation information is expressed by the following Formula 1:

$$R/R_0 = s/(\Sigma(I_i^k \times t_i)) + p/(\Sigma(IOD_j^k \times tOD_j)). \quad \text{Formula 1}$$

Here, the sign "R" denotes a luminance, and the sign "$R_0$" denotes an initial luminance value of the OLED panel 11. The sign "$I_i$" denotes an electric current value per area in an i-th electric current range at the rated electric current value IR. The sign "$t_i$" denotes a corresponding accumulated actual usage time in an i-th electric current range at the rated electric current value IR. The sign "$IOD_j$" denotes an electric current value per area in a j-th electric current range that is higher than the rated electric current value IR. The sign "$tOD_j$" denotes a corresponding accumulated actual usage time in a j-th electric current range that is higher than the rated electric current value IR. The accumulated actual usage time represents a value obtained by accumulating a time in which an electric current actually flows to the OLED panel 11 of the OLED lighting device LPa. The accumulated actual usage time represents, for example, a value obtained by accumulating a usage time of the OLED lighting device in the continuous application driving, or a value obtained by multiplying a pulse width (pulse duration) by a cumulative pulse number in the pulse application driving. The sign "k" denotes a characteristic value peculiar to the OLED panel 11. The signs "s" and "p" denote constant parameters. The value k and the parameters s and p are obtained by way of statistical processing using a plurality of samples.

The first term in Formula 1 corresponds to first information representing a first correlation between an electric current value and an accumulated actual usage time of the OLED lighting device LPa, and a luminance value of the OLED lighting device LPa when driving the OLED lighting device LPa by applying an electric current to the OLED lighting device LPa at the rated electric current value IR or lower. The second term in Formula 1 corresponds to second information representing a second correlation between an electric current value and an accumulated actual usage time of the OLED lighting device LPa, and a luminance value of the OLED lighting device LPa in the pulse application driving for driving the OLED lighting device LPa by applying an electric current to the OLED lighting device LPa at a value higher than the rated electric current value IR.

Each of the electric current ranges is set for, for example, a simplified calculation such that degrees of deterioration of the OLED panel 11 become substantially equal even at different electric current values in the electric current application. Besides, a representative value representing each of the electric current ranges is used for calculating a luminance R by Formula 1. For instance, as shown in FIG. 2, the following six electric current ranges of first to six electric current ranges are provided: i1≤I≤i2; i2<I≤i3; i3<I≤i4; i4<I≤i5; i5<I≤i6; and i6<I≤i7. First to sixth representative values Im1, Im2, Im3, Im4, Im5, Im6 respectively representing the first to the sixth electric current ranges (i1≤Im1≤i2, i2<Im2≤i3, i3<Im3≤i4, i4<Im4≤i5, i5<Im5≤i6, i6<Im6≤i7) are used for calculating the luminance R by Formula 1.

The control processing section 23a is a circuit for controlling the respective parts and sections 21, 22, 24a, 25, 26a of the controlling device CTa in accordance with their operations, controlling turning-on and turning-off of the OLED lighting device LPa and a light amount thereof, and calculating a luminance value, an estimated luminance value, and an available actual usage time of the OLED lighting device LPa. The control processing section 23a may be configured to include, for example, a central processing unit (CPU) and a peripheral circuit thereround. The control processing section 23a operably establishes a controller 231, a usage time arithmetic processor 232, a usage information arithmetic processor 233a, a luminance calculator 234a, a luminance estimator 235a, and a lifetime estimator 236a by executing a corresponding control processing program.

The controller 231 controls each of the parts and the sections 21, 22, 24a, 25, 26a of the controlling device CTa in accordance with the operability of each of these parts and sections, and controls the entirety of the controlling device CTa.

The usage time arithmetic processor 232 calculates an actual usage time of the OLED lighting device LPa. Specifically, for instance, the usage time arithmetic processor 232 calculates, in the continuous application driving (at the continuous application drive mode), a usage time of the OLED lighting device LPa as an actual usage time by, for example, a measurement per second for a period from a start to a finish of an electric power supply from the electric power output part 21 to the OLED lighting device LPa (i.e., for a period from a start to a finish of a one-time use of the OLED lighting device PLa). Besides, for instance, the usage time arithmetic processor 232 measures, in the pulse application driving (at the pulse application drive mode), a pulse number for a period from a start to a finish of an electric power supply from the electric power output part 21 to the OLED lighting device LPa (i.e., for a period from a start to a finish of a one-time use of the OLED lighting device PLa), and calculates, as the actual usage time, a multiplier value obtained by multiplying a pulse width by the pulse number.

The usage information arithmetic processor 233a updates the accumulated actual usage time by adding the actual usage time calculated by the usage time arithmetic processor 232 to the accumulated actual usage time stored in the usage information storage part 13 and represented as the usage information with respect to a specific electric current range corresponding to the electric current value of the electric power output from the electric power output part 21, and causes the usage information storage part 13 to store usage information representing the updated accumulated actual usage time. Specifically, in the embodiment, the usage information arithmetic processor 233a receives and reads, from the OLED lighting device LPa, usage information stored in the usage information storage part 13 with respect to a specific electric current range corresponding to the electric current value of the electric power output from the electric power output part 21. The usage information arithmetic processor 233a updates the accumulated actual usage time by adding the actual usage time calculated by the usage time arithmetic processor 232 to the accumulated actual usage time represented as the read usage information, transmits and writes usage information representing the updated accumulated actual usage time to the OLED lighting device LPa, and causes the usage information storage part 13 to store the transmitted and written usage information.

As described above, the usage time arithmetic processor 232 calculates the actual usage time from the start to the finish of the one-time use of the OLED lighting device PLa. Here, the usage information arithmetic processor 233a may update the accumulated actual usage time in the usage information storage part 13 based on the actual usage time calculated by the usage time arithmetic processor 232. However, when the one-time use of the OLED lighting device PLa takes a relatively long time, there is a possibility that the usage information arithmetic processor 233a may fail to update the accumulated actual usage time stored in the usage information storage part 13 due to, for example, an occurrence of an inconvenient incidence during the one-time use of the OLED lighting device PLa. For this reason, in the embodiment, an actual usage time is calculated and the accumulated actual usage time stored in the usage information storage part 13 is updated after every lapse of a predetermined time that is set in advance. Specifically, the usage time arithmetic processor 232 calculates the actual usage time from a start to a finish of the predetermined time for a period from a start to a finish of an electric power supply from the electric power output part 21 to the OLED lighting device LPa (i.e., for a period from a start to a finish of a one-time use of the OLED lighting device PLa) after every lapse of the predetermined time. When the usage time arithmetic processor 232 calculates the actual usage time, the usage information arithmetic processor 233a receives and reads, from the OLED lighting device LPa, the usage information stored in the usage information storage part 13 with respect to a specific electric current range corresponding to the electric current value of the electric power output from the electric power output part 21. The usage information arithmetic processor 233a updates the accumulated actual usage time by adding the actual usage time calculated by the usage time arithmetic processor 232 to the accumulated actual usage time represented as the read usage information, transmits and writes usage information representing the updated accumulated actual usage time to the OLED lighting device LPa, and causes the usage information storage part 13 to store the transmitted and written usage information. The predetermined time may take any value, for example, may be set appropriately to 10 minutes, 20 minutes, 30 minutes, one hour, two hours, and other time in accordance with a way of use of the OLED driving system Sa.

The luminance calculator 234a calculates a luminance value of the OLED lighting device LPa corresponding to the usage information stored in the usage information storage part 13 with respect to each of the electric current ranges by using the correlation information stored in the correlation information storage part 261.

The luminance estimator 235a obtains, based on the prospective accumulated actual usage time acquired by the prospection acquisition part 24a with respect to each of the electric current ranges, prospective usage information corresponding to the usage information with respect to each of the electric current ranges, and estimates a luminance value of the OLED lighting device LPa corresponding to the usage information stored in the usage information storage part 13 of the OLED lighting device LPa with respect to each of the electric current ranges and corresponding to the prospective usage information with respect to each of the electric current rages by using the correlation information.

The lifetime estimator 236 obtains, based on an available actual usage time representing an actual time until a lifetime luminance value defined as a lifetime of the OLED lighting device LPa in advance and a prospective electric current value acquired by the prospection acquisition part 24a, lifetime usage information corresponding to the usage information with respect to each of the electric current ranges, and calculates the available actual usage time based on the lifetime luminance value, the usage information stored in the usage information storage part 13 with respect to each of the electric current ranges, and the obtained lifetime usage information with respect to each of the electric current ranges by using the correlation information.

The controlling device CTa may include an unillustrated and predetermined casing (second casing or second housing) integrally accommodating the electric power output part 21, the C memory input and output IF part 22, the control processing section 23a, the prospection acquisition part 24a, the output part 25, and the storage section 26a. Alternatively, the controlling device CTa may independently include a first unit (driving unit) DV having the electric power output part 21, and a second unit (controlling main body unit) having the C memory input and output IF part 22, the control processing section 23a, the prospection acquisition part 24a, the output part 25, and the storage section 26a, each of the units being shown by a long-dashed dotted line in FIG. 1. In this case, the controlling main body unit is configurable by a personal computer of, for example, a tablet type, a laptop type, or a desktop type.

Here, in the embodiment, the C memory input and output IF part 22 and the usage information arithmetic processor 233a serve as an exemplary usage information writer which updates the accumulated actual usage time by adding the actual usage time calculated by the usage time arithmetic processor to the accumulated actual usage time stored in the usage information storage part and represented as the usage information with respect to a specific electric current range corresponding to the electric current value of the electric power output from the electric power output part, and causes the usage information storage part to store usage information representing the updated accumulated actual usage time.

Next, operations in relation to the embodiment will be described. Each of the OLED lighting device LPa and the controlling device CTa in the OLED driving system Sa having the above-described configuration initializes necessary parts and sections thereof when its power source is turned on, and then starts the operations thereof. The control processing section 23a in the controlling device CTa is configured to operably establish the controller 231, the usage time arithmetic processor 232, the usage information arithmetic processor 233a, the luminance calculator 234a, the luminance estimator 235a, and the lifetime estimator 236a in accordance with an execution of a corresponding control processing program.

Firstly, the controlling device CTa first receives an input of a drive mode and a target luminance (target electric current value) to turn on or off the OLED lighting device LPa. For instance, the drive mode and the target luminance (target electric current value) are acquired via the prospection acquisition part 24a. Here, only the drive mode may be input, and the target luminance (target electric current value) may be set in advance in accordance with the drive mode and stored in the storage section 26a or the usage information storage part 13.

When the CW application drive mode is selected as the drive mode, the controlling device CTa causes the controller 231 to continuously supply an electric power from the electric power output part 21 to the OLED lighting device LPa at an electric current value (target electric current value) of the target luminance via the cable CBa. Accordingly, the OLED panel 11 is caused to start a light emission for always emitting illumination light. Further, the controlling device CTa suspends the electric power supply from the electric power output part 21 to suspend the light emission from the OLED panel 11 in response to, for example, an input of a timeout of a lighting time period or a finish of lighting, thereby finishing the light emission. In this manner, the light emission for the illumination light is finished. As described above, the usage time arithmetic processor 232 and the usage information arithmetic processor 233a repeat a sequence of operations to be described below for a period from a start to a finish of a use of the OLED lighting device LPa after every lapse of a predetermined time. When a usage finish time of the OLED lighting device LPa and a finish time of the predetermined time do not match each other, the usage time arithmetic processor 232 and the usage information arithmetic processor 233a may execute a specific operation in the sequence of operations as a final operation by defining the usage finish time of the OLED lighting device LPa as the finish time of the predetermined time. Alternatively, the usage time arithmetic processor 232 and the usage information arithmetic processor 233a may execute a specific operation in the sequence of operations as a final operation at the finish time of the predetermined time coming after the finish of the use of the OLED lighting device LPa.

The usage time arithmetic processor 232 calculates a usage time of the OLED lighting device LPa as an actual usage time by a measurement per second from a start to a finish of the predetermined time. When the usage time arithmetic processor 232 calculates the actual usage itime, the usage information arithmetic processor 233a receives and reads, from the OLED lighting device LPa, the usage information stored in the usage information storage part 13 with respect to a specific electric current range corresponding to the electric current value of the electric power output from the electric power output part 21. The usage information arithmetic processor 233a updates the accumulated actual usage time by adding the actual usage time calculated by the usage time arithmetic processor 232 to the accumulated actual usage time represented as the read usage information, transmits and writes usage information representing the updated accumulated actual usage time to the OLED lighting device LPa, and causes the usage information storage part 13 to store the transmitted and written usage information. Specifically, for instance, the usage information arithmetic processor 233a receives a notification of the target electric current value that the controller 231 causes the electric power output part 21 to output therefrom. The usage information arithmetic processor 233a transmits, to the L memory input and output IF part 12 of the OLED lighting device LPa via the C memory input and output IF part 22, a communication signal (accumulated actual usage time reading instructive communication signal) containing an instruction (reading instruction, reading order, reading command) of reading the accumulated actual usage time registered in the accumulated actual usage time field 2612 in the record that registers the electric current range including the notified target electric current value to acquire the accumulated actual usage time with respect to the electric current range containing the notified target electric current value. Upon receipt of the accumulated actual usage time reading instructive communication signal, the L memory input and output IF part 12 reads, from the usage information storage part 13, the accumulated actual usage time registered in the accumulated actual usage time field 2612 in the record that registers the electric current range including the target electric current value contained in the accumulated actual usage time reading instructive communication signal, and transmits (replies), to the controlling device CTa, a communication signal (accumulated actual usage time notification communication signal) containing the read accumulated actual usage time. Upon receipt of the accumulated usage time notification communication signal, the usage information arithmetic processor 233a adds the actual usage time calculated by the usage time arithmetic processor 232 to the accumulated actual usage time contained in the accumulated actual usage time notification communication signal. Moreover, the usage information arithmetic processor 233a transmits, to the L memory input and output IF part 12 of the OLED lighting device LPa via the C memory input and output IF part 22, a communication signal (accumulated actual usage information writing instructive communication signal) containing an instruction (writing instruction, writing order, writing command) of writing the notified target electric current value, the accumulated actual usage time of the OLED lighting device LPa reflecting the addition, and the relevant data to the usage information storage part 13.

Upon receipt of the accumulated actual usage information writing instructive communication signal, the L memory input and output IF part 12 registers (overwrites) the accumulated actual usage time contained in the received accumulated actual usage information writing instructive communication signal in (to) the accumulated actual usage time field 2612 in the record that registers, in the electric current range field 2611, the target electric current value contained in the received communication signal, and the usage information storage part 13 stores the registered or overwritten accumulated actual usage time.

When the pulse application mode (NP application drive mode or ODP application mode) is selected as the drive mode, the controlling device CTa causes the controller 231 to supply a pulsed electric power from the electric power output part 21 to the OLED lighting device LPa via the cable CBa at an electric current value (target electric current value) of the target luminance, thereby causing the OLED panel 11 to start a light emission for emitting illumination light which has been modulated (illumination light which has been modulated under a PWM) or emitting illumination light in a flashing manner. A start time of supplying the pulsed electric power to the OLED lighting device LPa is determined in response to a trigger input from an external device, e.g., a camera, for taking an image of a workpiece target. As described above, the usage time arithmetic processor 232 and the usage information arithmetic processor 233a repeat a sequence of operations to be described below for a period from a start to a finish of a use of the OLED lighting device LPa after every lapse of a predetermined time. The usage time arithmetic processor 232 calculates, as the accumulated actual usage time, a multiplier value obtained by measuring a pulse number from a start to a finish of the predetermined time and multiplying a pulse width by the pulse number. When the usage time arithmetic processor 232 calculates the actual usage time, the usage information arithmetic processor 233a receives and reads, from the OLED lighting device LPa, the usage information stored in the usage information storage part 13 with respect to a specific electric current range corresponding to the electric current value of the electric power output from the electric power output part 21, in the same manner at the CW application drive mode. The usage information arithmetic processor 233a updates the accumulated actual usage time by adding the actual usage time calculated by the usage time arithmetic processor 232 to the accumulated actual usage time represented as the read usage information, transmits and writes usage information representing the updated accumulated actual usage time to the OLED lighting device LPa, and causes the usage information storage part 13 to store the transmitted and written usage information.

The controlling device CTa causes the usage information storage part 13 of the OLED lighting device LPa to store the usage information in association with the electric current range per use of the OLED lighting device LPa.

Secondly, the OLED lighting device LPa includes the usage information storage part 13 in the embodiment. This configuration permits, in a calculation of a luminance value of the OLED lighting device LPa, the luminance calculator 234a to transmit a communication signal (usage information reading instructive communication signal) containing an instruction of reading usage information to the L memory input and output IF part 12 of the OLED lighting device LPa via the C memory input and output IF part 22 for, for example, controlling the luminance value of the OLED lighting device LPa or responding to an input of an instruction of calculating the luminance value. Upon receipt of the usage information reading instructive communication signal, the L memory input and output IF part 12 reads, from the usage information storage part 13, the usage information stored in the usage information storage part 13 with respect to each of the electric current ranges, and transmits (replies), to the controlling device CTa, a communication signal (usage information notification communication signal) containing the read usage information with respect to each of the electric current ranges. In the embodiment, the rated electric current value IR (an electric current value i5 in the example shown in FIG. 2) and the OD maximal capacity electric current value IL (an electric current value i7 in the example shown in FIG. 2) each stored in the usage information storage part 13 are transmitted (replied) to the controlling device CTa as well. For instance, the usage information notification communication signal sequentially contains the electric current range and the accumulated actual usage time respectively registered in the electric current range field 2611 and the accumulated actual usage time field 2612 for each record. The usage information notification communication signal further contains the rated electric current value IR and the OD maximal capacity electric current value IL. Upon receipt of the usage information notification communication signal, the luminance calculator 234a calculates a luminance value of the OLED lighting device LPa corresponding to the accumulated actual usage information with respect to each of the electric current ranges contained in the received usage information notification communication signal by using correlation information (corresponding to Formula 1 in the embodiment) stored in the correlation information storage part 261. Further, for example, the controlling device CTa controls the OLED lighting device LPa by causing the controller 231 to adjust the electric current value of the OLED lighting device LPa to achieve a predetermined target luminance value based on the calculated luminance value. Moreover, for instance, the controlling device CTa causes the controller 231 to output the calculated luminance value to the output part 25.

For instance, in the example shown in FIG. 2, the usage information notification communication signal contains the ranges "i1≤I≤i2, T11; i2<I≤i3, T12; i3<I≤i4, T13; i4<I≤i5, T14; i5<I≤i6, T15; i6<I≤i7, T16; i5; i7". The luminance calculator 234a calculates $R/R_0 = s/(Im_1^k \times T11 + Im_2^k \times T12 + Im_3^k \times T13 + Im_4^k \times T14) + p/(Im_5^k \times T15 + Im_6^k \times T16)$ by applying the usage information to Formula 1. In this way, a luminance value R is calculated. Here, in the calculation, a Σ calculation is executed for the CW application drive mode and the NP application drive mode independently. In this case, a constant parameter s may be set for each of the CW application drive mode and the NP application drive mode.

Thirdly, when the prospection acquisition part 24a acquires a prospective accumulated actual usage time with respective to each of the electric current ranges set (designated) by a user, the luminance estimator 235a acquires usage information with respect to each of the electric current ranges by transmitting a usage information reading instructive communication signal and receiving a usage information notification communication signal for estimating a luminance value of the OLED lighting device LPa, in the same manner described above. The luminance estimator 235a obtains, based on the prospective accumulated actual usage time acquired by the prospection acquisition part 24a with respect to each of the electric current ranges, prospective usage information corresponding to the usage information with respect to each of the electric current ranges. The luminance estimator 235a further estimates, by using the correlation information (corresponding to Formula 1 in the embodiment) stored in the correlation information storage part 261, a luminance value of the OLED lighting device LPa corresponding to the acquired usage information with respect to each of the electric current ranges and corresponding to the obtained prospective usage information with respect to each of the electric current ranges. Then, the controlling device CTa causes the controller 231 to output the calculated estimated luminance value to the output part 25.

For instance, in the example shown in FIG. 2, the prospection acquisition part 24a acquires, as the prospective accumulated actual usage time with respect to each of the electric current ranges, a prospective accumulated actual usage time T1x at an electric current value ix (i2<ix≤i3) and a prospective accumulated actual usage time T2y with respect to an electric current value iy (i5<iy≤i6). In this case, the luminance estimator 235a obtains, as prospective usage information, i2<I≤i3, T1x; i5<I≤i6, T2y, and calculates $R/R_0 = s/(Im1^k \times T11 + Im2^k \times (T12+T1y) + Im3^k \times T13 + Im4^k \times T14) + p/(Im5^k \times (T15+Ty2) + Im6^k \times T16)$ by using Formula 1. In this way, an estimated luminance value R is calculated.

Fourthly, when the prospection acquisition part 24a acquires a prospective electric current value set (designated) by the user, the lifetime estimator 236a acquires usage information with respect to each of the electric current ranges by transmitting a usage information reading instructive communication signal and receiving a usage information notification communication signal for calculating a lifetime of the OLED lighting device LPa, in the same manner as described above. Like the luminance estimator 235a, the lifetime estimator 236a obtains, based on an available actual usage time and the prospective electric current value acquired by the prospection acquisition part 24a, lifetime usage information corresponding to the usage information with respect to each of the electric current ranges, and calculates the available actual usage time based on the lifetime luminance value, the usage information stored in the usage information storage part 13 with respect to each of the electric current ranges, and the obtained lifetime usage information with respect to each of the electric current ranges, by using the correlation information (corresponding to Formula 1 in the embodiment). Further, the controlling device CTa causes the controller 231 to output the calculated available usage time as the lifetime to the output part 25.

For instance, in the example shown in FIG. 2, the prospection acquisition part 24a acquires an electric current value iz (i3<iz≤i4) as the prospective electric current value. In this case, when the available actual usage time is defined as T1z, the lifetime estimator 236a obtains i3<I≤i4, T1z as the lifetime usage information. Moreover, when the lifetime luminance value is defined as Rz, the lifetime estimator 236a calculates T1z which satisfies $Rz/R_0 = s/(Im1^k \times T11 + Im2^k \times T12 + Im3^k \times (T13+T1z) + Im4^k \times T14) + p/(Im5^k \times T15 + Im6^k \times T16)$.

For instance, in the example shown in FIG. 2, the prospection acquisition part 24a acquires an electric current value iw (i6<iz≤i7) as the prospective electric current value. In this case, when the available actual usage time is defined as T2w, the lifetime estimator 236a obtains i6<I≤i7, T1z as the lifetime usage information. Furthermore, when the lifetime luminance value is defined as Rz, the lifetime estimator 236a calculates T2w which satisfies $Rz/R_0 = s/(Im1^k \times T11 + Im2^k \times T12 + Im3^k + Im4^k \times T14) + p/(Im5^k \times T15 + Im6^k \times T16 \quad (T16+T2w))$.

As described above, each of the OLED driving system Sa and the OLED driving method for use therein according to the embodiment includes storing usage information representing an accumulated actual usage time of the OLED lighting device LPa in the usage information storage part 13 with respect to each of a plurality of electric current ranges different from one another. With this configuration, a damage to an OLED can be estimated based on the accumulated actual usage time with respect to each of the electric current ranges. Accordingly, it is possible to estimate a deterioration of an OLED more accurately under the knowledge of the inventor that the OLED tends to receive a more significant damage as an electric current is applied at a higher electric current value for driving and as an application time of the electric current is longer.

Each of the OLED driving system Sa and the OLED driving method including the luminance calculator 234a makes it possible to calculate a luminance value of the OLED lighting device LPa corresponding to the usage information stored in the usage information storage part 13 with respect to each of the electric current ranges, and evaluate (recognize) a degree of deterioration of the OLED at the calculated luminance value. The lifetime of the OLED lighting device can be evaluated from the calculated luminance value.

Each of the OLED driving system Sa and the OLED driving method including the prospection acquisition part 24a and the luminance estimator 235a is capable of estimating a luminance value after a prospective accumulated actual usage time, and evaluating (recognizing) a degree of deterioration of the OLED at the estimated luminance value. The lifetime of the OLED lighting device can be evaluated from the estimated luminance value.

Each of the OLED driving system Sa and the OLED driving method including the prospection acquisition part 24a and the lifetime estimator 236a is further capable of evaluating an available actual usage time (including a remaining available actual usage time of the lifetime, an available usage time in the continuous application driving, and a time obtained by multiplying a pulse width by a pulse number in the pulse application driving) when using the OLED lighting device LPa at a prospective electric current value acquired by the prospection acquisition part 24a.

According to the OLED driving system and the OLED driving method, the correlation information includes: first information in applying an electric current at the rated electric current value or lower; and second information in applying an electric current at a value higher than the rated electric current value. Consequently, it is possible to estimate a deterioration more accurately under the knowledge that a degree of damage to the OLED in applying an electric current at the rated electric current value or lower differs from that in applying an electric current at the value higher than the rated electric current value.

Meanwhile, in the embodiment, the OLED lighting device LPa includes the usage information storage part 13, and the controlling device CTa includes: the electric power output part 21; the usage time arithmetic processor 232; and the C memory input and output IF part 22 and the usage information arithmetic processor 233a as an exemplary usage information writer. However, the controlling device may include the usage information storage part.

Figure 4:
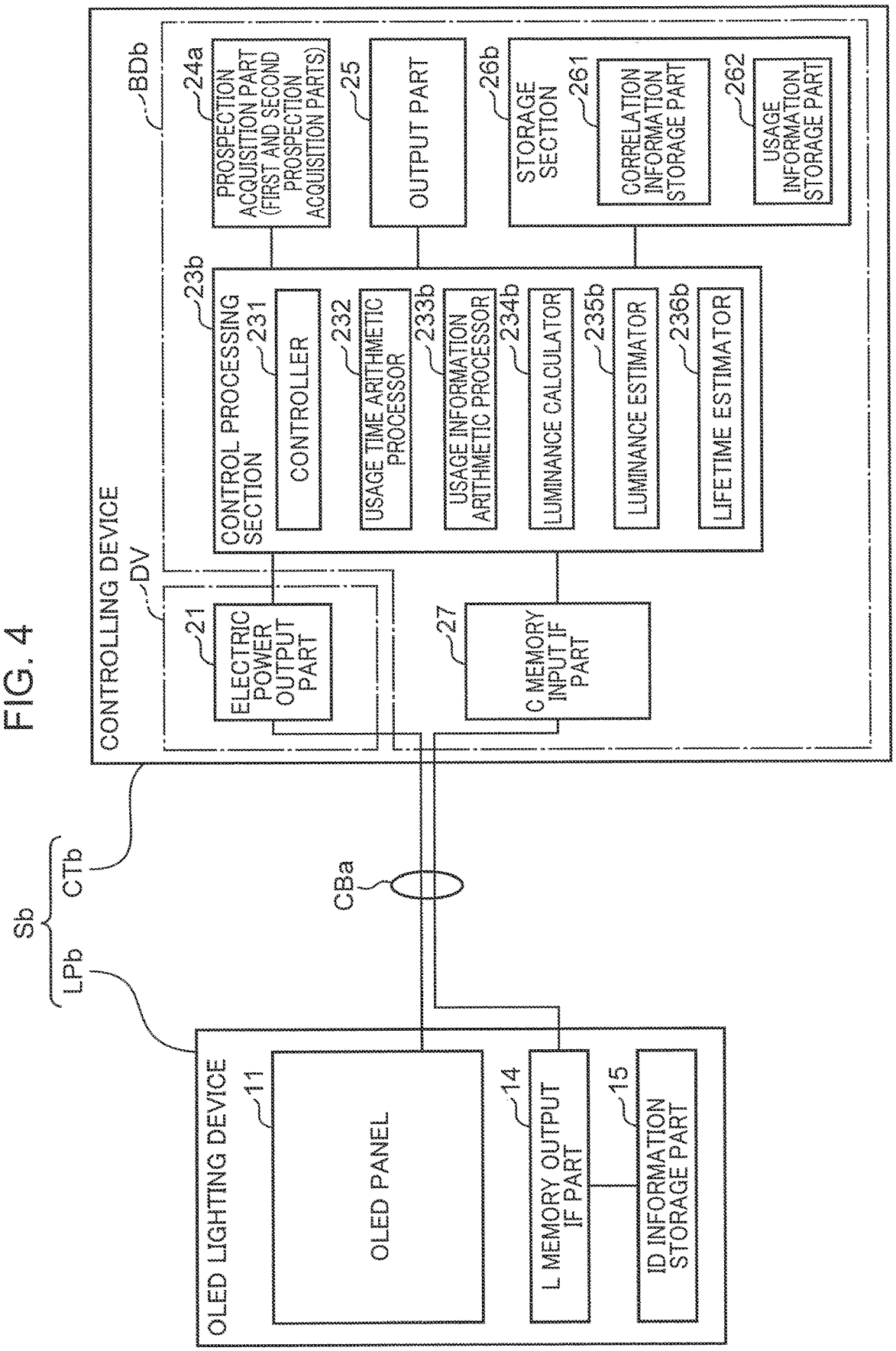
FIG. 4 is a diagram explaining a first modified embodiment of the OLED driving system, the OLED lighting device, and the controlling device.
Figure 5:
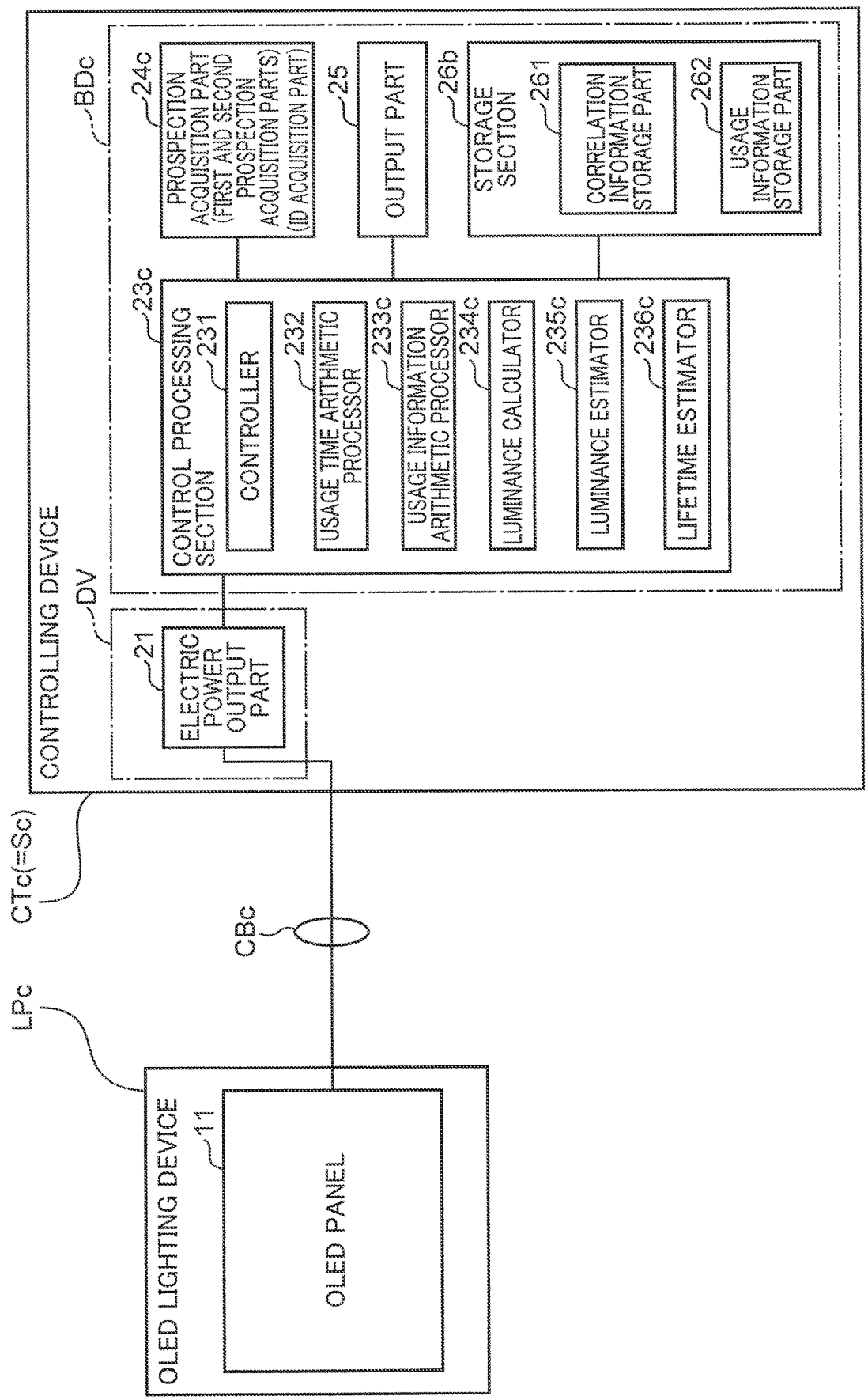
FIG. 5 is a diagram explaining a second modified embodiment of the OLED driving system, the OLED lighting device, and the controlling device.

FIG. 4 is a diagram explaining a first modified embodiment of the OLED driving system, the OLED lighting device, and the controlling device. FIG. 5 is a diagram explaining a second modified embodiment of the OLED driving system, the OLED lighting device, and the controlling device. FIG. 6 shows a modified usage information table stored in a usage information storage part in each of the first and the second modified embodiments.

As shown in FIG. 4, an OLED driving system Sb according to a first modified embodiment includes, for example, an OLED lighting device LPb, and a controlling device CTb connected to the OLED lighting device LPb via a cable CBa having the same configuration as the above-described cable.

The OLED lighting device LPb emits illumination light by using an OLED. As shown in FIG. 4, the OLED lighting device LPb includes, for example, an OLED panel 11, a lighting-side memory output interface part (L memory output IF part) 14, and an ID information storage part 15. These elements are accommodated in an unillustrated and predetermined casing (first casing or first housing) so that an emitting surface of the OLED panel 11 for the illumination light emission faces outside. The OLED panel 11 in the OLED lighting device LPb in the first modified embodiment corresponds to the OLED panel 11 in the OLED lighting device LPa. Thus, the description therefor is omitted.

The ID information storage part 15 is a circuit connected to the L memory output IF part 14 for storing ID information representing an identifier for specifying and identifying the OLED lighting device LPb. The usage ID information storage part 15 is configured to include a non-volatile storage element, e.g., a ROM and an EEPROM, and a peripheral circuit therearound. Alternatively, for instance, the ID information storage part 15 may be configured to include a dual in-line package (DIP) switch unit having a plurality of switches, and ON and OFF of each of the switches may respectively correspond to "0", "1" of digital signals.

The L memory output IF part 14 is a circuit connected to a communication line of the cable CBa for reading the ID information from the ID information storage part 15, and transmitting the ID information (a communication signal containing the ID information) to the controlling device CTb. The L memory output IF part 14 is configured to include, for example, a memory reading circuit, a USB interface circuit, and a peripheral circuit therearound.

The controlling device CTb controls an emission of illumination light and a suspension thereof, and a light amount of the illumination light by regulating an electric power supply to the OLED lighting device LPb via the cable CBa. As shown in FIG. 4, the controlling device CTb includes, for example, an electric power output part 21, a controlling-side memory input interface part (C memory input IF part) 27, a control processing section 23b, a prospection acquisition part 24a, an output part 25, and a storage section 26b. The electric power output part 21, the prospection acquisition part 24a, and the output part 25 in the controlling device CTb in the first modified embodiment respectively correspond to the electric power output part 21, the prospection acquisition part 24a, and the output part 25 in the controlling device CTa. Thus, the description therefor is omitted.

The C memory input IF part 27 is a circuit connected to the communication line of the cable CBa and the control processing section 23b for receiving the ID information (a communication signal containing the ID information) from the L memory output IF part 14 of the OLED lighting device LPb in accordance with a control of the control processing section 23b. The C memory input IF part 27 is configured to include, for example, a USB interface circuit and a peripheral circuit therearound.

The storage section 26b corresponds to the storage section 26a of the controlling device CTa except that the storage section 26b further serves as the usage information storage part. Specifically, the storage section 26b operably includes a usage information storage part 262 in addition to a correlation information storage part 261.

Like the usage information storage part 13, the usage information storage part 262 stores usage information representing a usage time of the OLED lighting device LPb with respect to each of a plurality of electric current ranges different from one another. In the first modified embodiment, the usage information storage part 262 stores the usage information with respect to each of the electric current ranges in connection with a plurality of OLED lighting devices LPb different from one another such that the lighting devices are connectable to one another. Specifically, for instance, the usage information storage part 262 stores, as shown in FIG. 6, a plurality of usage information tables UTb (UTb-1, UTb-2, UTb-3, and subsequent tables) like the usage information table UTa shown in FIG. 2. The usage information storage part 262 stores the usage information tables UTb-1, UTb-2, UTb-3, and subsequent tables in association with a plurality of pieces of ID information ID1, ID2, ID3, and subsequent ID information of the OLED lighting devices LPb different from one another. The usage information storage part 262 further stores a relevant rated electric current value IR and a relevant OD maximal capacity electric current value IL in association with each of the pieces of ID information.

The control processing section 23b is a circuit for controlling the respective parts and sections 21, 22, 24a, 25, 26b of the controlling device CTb in accordance with their operations, controlling turning-on and turning-off of the OLED lighting device LPb and a light amount thereof, and calculating a luminance value, an estimated luminance value, and an available usage time of the OLED lighting device LPb. The control processing section 23b is configured to include, for example, a CPU and a peripheral circuit therearound. The control processing section 23b further operably establishes a controller 231, a usage time arithmetic processor 232, a usage information arithmetic processor 233b, a luminance calculator 234b, a luminance estimator 235b, and a lifetime estimator 236b by executing a corresponding control processing program. The controller 231 and the usage time arithmetic processor 232 in the control processing section 23b in the first modified embodiment respectively correspond to the controller 231 and the usage time arithmetic processor 232 in the control processing section 23a. Thus, the description therefor is omitted.

The usage information arithmetic processor 233b, the luminance calculator 234b, the luminance estimator 235b, and the lifetime estimator 236b in the control processing section 23b in the first modified embodiment respectively correspond to the usage information arithmetic processor 233a, the luminance calculator 234a, the luminance estimator 235a, and the lifetime estimator 236a in the control processing section 23a except for use of the usage information table UTb stored in the usage information storage part 262 and corresponding to the ID information received from the OLED lighting device LPb in place of the usage information table UTa stored in the usage information storage part 13 of the OLED lighting device LPa.

For instance, the usage information arithmetic processor 233b updates an accumulated actual usage time by adding an actual usage time calculated by the usage time arithmetic processor 232 to the accumulated actual usage time stored in the usage information storage part 262 in association with the ID information acquired from the OLED lighting device LPb and represented as the usage information with respect to a specific electric current range corresponding to an electric current value of an electric power output from the electric power output part 21, and causes the usage information storage part 262 to store usage information representing the updated accumulated actual usage time.

Specifically, in the embodiment, the usage information arithmetic processor 233b first, for example, receives the ID information from the OLED lighting device LPb via the C memory input IF part 27. The usage information arithmetic processor 233b further receives a notification of a target electric current value which the controller 231 causes the electric power output part 21 to output therefrom. The usage information arithmetic processor 233b reads, from the usage information table UTb associated with the received ID information, the accumulated actual usage time registered in the accumulated actual usage time field 2612 in a record that registers a specific electric current range including the notified target electric current value. The usage information arithmetic processor 233b adds the actual usage time calculated by the usage time arithmetic processor 232 to the read accumulated actual usage time. The usage information arithmetic processor 233b registers (overwrites) the accumulated actual usage time reflecting the addition in (to) the accumulated actual usage time field 2612 in the record, which registers the specific electric current range including the notified target electric current value in the electric current range field 2611, in the usage information table UTb associated with the received ID information, and causes the usage information storage part 262 to store the registered or overwritten accumulated actual usage time.

The luminance calculator 234b, the luminance estimator 235b, and the lifetime estimator 236c can be described in the same manner as the description for the usage information arithmetic processor 233b. Thus, the description therefor is omitted.

The controlling device CTb in the first modified embodiment may include an unillustrated and predetermined casing (second casing or second housing) integrally accommodating the electric power output part 21, the C memory input IF part 27, the control processing section 23b, the prospection acquisition part 24a, the output part 25, and the storage section 26b. Alternatively, the controlling device CTb may independently include a first unit (driving unit) DV having the electric power output part 21, and a second unit (controlling main body unit) having the C memory input IF part 27, the control processing section 23b, the prospection acquisition part 24a, the output part 25, and the storage section 26b, each of the units being shown by a long-dashed dotted line in FIG. 4.

An OLED driving system Sc according to a second modified embodiment includes, for example, an OLED lighting device LPc, a controlling device CTc connected to the OLED lighting device LPc via a cable CBc as shown in FIG. 5. In the second modified embodiment, the controlling device CTc is dedicated to an electric power supply to the OLED lighting device LPc, and hence the cable CBc includes a power line for the electric power supply.

The OLED lighting device LPc emits illumination light by using an OLED. As shown in FIG. 5, the OLED lighting device LPc includes, for example, an OLED panel 11 accommodated in an unillustrated and predetermined casing (first casing or first housing) so that an emitting surface of the OLED panel 11 for the illumination light emission faces outside. The OLED panel 11 in the OLED lighting device LPc in the second modified embodiment corresponds to the OLED panel 11 in the OLED lighting device LPa. Thus, the description therefor is omitted.

Specifically, the OLED lighting device LPc is intended for general use, and the OLED driving system Sc according to the second modified embodiment is configured to include the controlling device CTc.

The controlling device CTc controls an emission of the illumination light and a suspension thereof, and a light amount of the illumination light by regulating the electric power supply to the OLED lighting device LPc via the cable CBc. As shown in FIG. 5, the controlling device CTc includes, for example, an electric power output part 21, a control processing section 23c, a prospection acquisition part 24c, an output part 25, and a storage section 26b. The electric power output part 21, the prospection acquisition part 24c, and the output part 25 in the controlling device CTc in the second modified embodiment respectively correspond to the electric power output part 21, the prospection acquisition part 24a, and the output part 25 in the controlling device CTa except that the prospection acquisition part 24c further acquires ID information. Thus, the description therefor is omitted. The storage section 26b in the controlling device CTc in the second modified embodiment corresponds to the storage section 26b in the controlling device CTb in the first modified embodiment. Thus, the description therefor is omitted.

The control processing section 23c is a circuit for controlling the respective parts and sections 21, 22, 24c, 25, 26b of the controlling device CTc in accordance with their operations, controlling the turning-on and the turning-off of the OLED lighting device LPc and the light amount thereof, and calculating a luminance value, an estimated luminance value, and an available usage time of the OLED lighting device LPc. The control processing section 23c is configured to include, for example, a CPU and a peripheral circuit therearound. The control processing section 23c further operably establishes a controller 231, a usage time arithmetic processor 232, a usage information arithmetic processor 233c, a luminance calculator 234c, a luminance estimator 235c, and a lifetime estimator 236c by executing a corresponding control processing program. The controller 231 and the usage time arithmetic processor 232 in the control processing section 23c in the second modified embodiment respectively correspond to the controller 231 and the usage time arithmetic processor 232 in the control processing section 23a. Thus, the description therefor is omitted.

The usage information arithmetic processor 233c, the luminance calculator 234c, the luminance estimator 235c, and the lifetime estimator 236c in the control processing section 23c in the second modified embodiment respectively correspond to the usage information arithmetic processor 233a, the luminance calculator 234a, the luminance estimator 235a, and the lifetime estimator 236a in the control processing section 23a except for use of the usage information table UTb stored in the usage information storage part 262 and corresponding to the ID information acquired from the prospection acquisition part 24c in place of the usage information table UTa stored in the usage information storage part 13 of the OLED lighting device LPa.

For instance, the usage information arithmetic processor 233c updates an accumulated actual usage time by adding an actual usage time calculated by the usage time arithmetic processor 232 to the accumulated actual usage time stored in the usage information storage part 262 in association with the ID information acquired from the prospection acquisition part 24c and represented as the usage information with respect to a specific electric current range corresponding to an electric current value of an electric power output from the electric power output part 21, and causes the usage information storage part 262 to store usage information representing the updated accumulated actual usage time.

Specifically, in the embodiment, the usage information arithmetic processor 233c first, for example, acquires the ID information of the OLED lighting device LPc via the prospection acquisition part 24c. For instance, a user assigns the ID information to the OLED lighting device LPc in advance. The user inputs the assigned ID information to the controlling device CTc via the prospection acquisition part 24c. Here, a serial number of the OLED lighting device LPc may be adoptable as the ID information. The usage information arithmetic processor 233c then receives a notification of a target electric current value which the controller 231 causes the electric power output part 21 to output therefrom. The usage information arithmetic processor 233c reads, from the usage information table UTb associated with the acquired ID information, an accumulated actual usage time registered in the accumulated actual usage time field 2612 in a record that registers a specific electric current range including the notified target electric current value, and adds the actual usage time calculated by the usage time arithmetic processor 232 to the read accumulated actual usage time field. The usage information arithmetic processor 233c registers (overwrites) the accumulated actual usage time reflecting the addition in (to) the accumulated actual usage time field 2612 in the record, which registers the specific electric current range including the notified target electric current value in the electric current range field 2611, in the usage information table UTb associated with the acquired ID information, and causes the usage information storage part 262 to store the registered or overwritten accumulated actual usage time.

The luminance calculator 234c, the luminance estimator 235c, and the lifetime estimator 236c can be described in the same manner as the description for the usage information arithmetic processor 233c. Thus, the description therefor is omitted.

The controlling device CTc in the second modified embodiment may include an unillustrated and predetermined casing (second casing or second housing) integrally accommodating the electric power output part 21, the control processing section 23c, the prospection acquisition part 24c, the output part 25, and the storage section 26b. Alternatively, the controlling device CTc may independently include a first unit (driving unit) DV having the electric power output part 21, and a second unit (controlling main body unit) having the control processing section 23c, the prospection acquisition part 24c, the output part 25, and the storage section 26b, each of the units being shown by a long-dashed dotted line in FIG. 5.

Additionally, in the embodiments, each of the OLED driving systems Sa to Sc may further include a temperature acquisition part which acquires a usage temperature of each of the OLED lighting devices LPa to LPc. The usage information storage part 13, 261 may store usage information representing an accumulated actual usage time and the usage temperature of each of the OLED lighting devices LPa to LPc with respect to each of a plurality of electric current ranges different from one another. Each of the usage information arithmetic processors 233a to 233c may update the accumulated actual usage time by adding an actual usage time calculated by the usage time arithmetic processor 232 to the accumulated actual usage time stored in the usage information storage part 13, 261 and represented as the usage information with respect to a specific electric current range corresponding to an electric current value of an electric power output from the electric power output part 21, and cause the usage information storage part 13, 261 to store usage information representing the updated accumulated actual usage time and the usage temperature of each of the OLED lighting devices LPa to LPc acquired by the temperature acquisition part. In this configuration, the usage temperature is also stored as the usage information. This configuration consequently makes it possible to estimate a deterioration in consideration of the usage temperature, resulting in achievement of more accurate estimation of the deterioration. The temperature acquisition part may include, for example, a temperature measurer, e.g., a thermistor, and a usage temperature calculator arranged in each of the controlling devices CTa to CTc. The temperature measurer measures an environmental temperature, and the usage temperature calculator calculates the usage temperature of each of the OLED lighting devices LPa to LPc in an equilibrium state based on the environmental temperature measured by the temperature measurer and the electric power supplied from the electric power output part 21 to each of the OLED lighting devices LPa to LPc.

In each of the OLED driving systems Sa to Sc, each of the luminance calculators 234a to 234c calculates a luminance value of each of the OLED lighting devices LPa to LPc corresponding to the usage information stored in the usage information storage part 13, 262 with respect to each of the electric current ranges by using correlation information (second correlation information) representing a correlation between the electric current value, the accumulated actual usage time, and the usage temperature of each of the OLED lighting devices LPa to LPc, and a corresponding luminance value of each of the OLED lighting devices LPa to LPc. The prospection acquisition part 24a, 24c acquires a prospective accumulated actual usage time of each of the OLED lighting devices LPa to LPc with respect to each of the electric current ranges and a usage temperature at the prospective accumulated actual usage time. Each of the luminance estimators 235a to 235c obtains, based on the prospective accumulated actual usage time with respect to each of the electric current range and the usage temperature acquired by the prospection acquisition part 24a, 24c, prospective usage information corresponding to the usage information with respect to each of the electric current ranges, and estimates a luminance value of each of the OLED lighting devices LPa to LPc corresponding to the usage information stored in the usage information storage part 13, 262 with respect to each of the electric current ranges and corresponding to the obtained prospective usage information with respect to each of the electric current rages by using the second correlation information. The prospection acquisition part 24a, 24c acquires a prospective electric current value and a prospective usage temperature. Each of the lifetime estimators 236a to 236c obtains, based on an available actual usage time and based on the prospective electric current value and the usage temperature acquired by the prospection acquisition part 24a, 24c, lifetime usage information corresponding to the usage information with respect to each of the electric current ranges, and calculates the available actual usage time based on a lifetime luminance value, the usage information stored in the usage information storage part 13, 262 with respect to each of the electric current ranges, and the obtained lifetime usage information with respect to each of the electric current ranges by using the second correlation information. The second correlation information includes: first information representing a first correlation between an electric current value, an accumulated actual usage time, and a usage temperature of each of the OLED lighting device LPa to LPc, and a luminance value of each of the OLED lighting devices LPa to LPc when driving each of the OLED lighting devices LPa to LPc by applying an electric current to each of the OLED lighting devices LPa to LPc at a rated electric current value or lower; and second information representing a second correlation between an electric current value, an accumulated actual usage time, and a usage temperature of each of the OLED lighting devices LPa to LPc, and a luminance value of each of the OLED lighting devices LPa to LPc when driving each of the OLED lighting devices LPa to LPc by applying an electric current to each of the OLED lighting devices LPa to LPc at a value higher than the rated electric current value.

The second correlation information is obtained by way of, for example, statistical processing using a plurality of samples in advance. The correlation information storage part 261 stores the second correlation information in the form of, for example, a lookup table or a function expression. The second correlation information is expressed, for example, by the following Formula 2:

$$R/R_0 = s/(\Sigma(I_i^k \times t_i \times \alpha)(t)_i) + p/(\Sigma(IOD_j^k \times tOD_j \times \beta(t)_j)). \qquad \text{Formula 2}$$

Here, the sign "$\alpha(t)_i$" denotes a temperature parameter with respect to a temperature t in an i-th electric current range at the rated electric current value IR or lower. The sign "$\beta(t)_j$" denotes a temperature parameter with respect to a temperature t in a j-th electric current range that is higher than the rated electric current value IR. The temperature parameters $\alpha(t)_i$, $\beta(t)_j$ are obtained by way of, for example, statistical processing using a plurality of samples in advance, and increase in accordance with a rise in the temperature when a room temperature is defined as, for example, a reference value 1.

In the embodiments, each of the controlling devices CTa to CTc compares the luminance value calculated by each of the luminance calculators 234a to 234c with a preset determination threshold Th. Each of the controlling devices CTa to CTc may be configured to notify, to the outside, a case where the calculated luminance value is equal to or lower than the determination threshold Th by way of, for example, lump lighting or sound emission from a buzzer. For instance, setting of the determination threshold Th to a luminance value representing a lifetime of each of the OLED lighting devices LPa to LPc permits the notification of the lifetime of each of the OLED lighting devices LPa to LPc to the outside.

In the embodiments, the usage information table UTa, UTb is configured to include the accumulated actual usage time field 2612. As described above, the lifetime is calculated depending on whether an electric current value for a current application is equal to or lower than the rated electric current value IR. In this respect, the usage information table UTa, UTb may include, in place of the accumulated actual usage time field 2612, a first accumulated actual usage time sub-field for registering an accumulated actual usage time at the rated electric current value IR or lower for the electric current application, and a second accumulated actual usage time sub-field for registering an accumulated actual usage time at an electric current value higher than the rated electric current value IR and equal to or lower than an OD maximal capacity electric current value IL (not shown) for the electric current application. Alternatively, the usage information table UTa, UTb may include an electric current range field, and a cumulative pulse number field for registering a cumulative pulse number in a specific electric current range registered in the electric current range field in adoption of a pulse width and the cumulative pulse number as the usage information, and may further have a record with respect to each of the electric current ranges (not shown). In this case, at least one of the usage information storage part 13 and the storage sections 26a, 26b stores the pulse width (pulse duration). Further alternatively, the usage information table UTa, UTb may include an electric current range field and an accumulated usage time field for registering an accumulated usage time in a specific electric current range registered in the electric current range field in adoption of the accumulated usage time and a duty ratio as the usage information, and further may have a record with respect to each of the electric current range field. In this case, at least one of the usage information storage part 13 and the storage sections 26a, 26b stores the duty ratio.

Various aspects of technologies are disclosed in this specification as described above. Main technologies among them will be summarized below.

An OLED driving system according to one aspect includes: a usage information storage part which stores usage information representing an accumulated actual usage time of the OLED lighting device with respect to each of a plurality of electric current ranges different from one another; an electric power output part which outputs an electric power at a changeable electric current value to drive the OLED lighting device at a predetermined target luminance; a usage time arithmetic processor which calculates an actual usage time of the OLED lighting device; and a usage information writer which updates the accumulated actual usage time by adding the actual usage time calculated by the usage time arithmetic processor to the accumulated actual usage time stored in the usage information storage part and represented as the usage information with respect to a specific electric current range corresponding to the electric current value of the electric power output from the electric power output part, and causes the usage information storage part to store usage information representing the updated accumulated actual usage time. The OLED driving system preferably includes an OLED lighting device and a controlling device which controls the OLED lighting device. Preferably, the OLED lighting device includes the usage information storage part, and the controlling device includes the electric power output part, the usage time arithmetic processor, and the usage information writer. The controlling device preferably includes a first unit (driving unit) having the electric power output part and a second unit (controlling main body unit) having the usage time arithmetic processor and the usage information writer. Preferably, the OLED driving system includes the controlling device which controls the OLED lighting device, and the usage information storage part stores the usage information in association with an identifier for specifying and identifying the OLED lighting device. The controlling device includes the usage information storage part, the electric power output part, the usage time arithmetic processor, the usage information writer, and an identifier acquisition part which acquires the identifier. The controlling device preferably includes a first unit (driving unit) having the electric power output part and a second unit (controlling main body unit) having the usage time arithmetic processor, the usage information writer, and the identifier acquisition part. In a continuous application driving (continuous application drive mode) for driving the OLED lighting device by continuously applying an electric current to the OLED lighting device in the OLED driving system, preferably, the usage information directly represents an accumulated actual usage time representing a value of an accumulated usage time of the OLED lighting device. In a pulse application driving (pulse application drive mode) for driving the OLED lighting device by applying a pulsed electric current to the OLED lighting device in the OLED driving system, preferably, the usage information represents: an accumulated actual usage time representing a value obtained by multiplying a pulse width (pulse duration) by a cumulative pulse number; the pulse width (pulse duration) and the cumulative pulse number; an accumulated actual usage time representing a value obtained by accumulating an actual usage time calculated by multiplying a usage time of the OLED lighting device LPa by a duty ratio; or a value of each of the accumulated usage time obtained by accumulating the usage time of the OLED lighting device and the duty ratio.

The inventor has obtained the knowledge that an OLED tends to receive a more significant damage as an electric current value given for driving is higher and as an application time of an electric current is longer. The OLED driving system including the usage information storage part which stores the usage information representing the accumulated actual usage time of the OLED lighting device with respect to each of the electric current ranges different from one another can estimate a damage to the OLED based on the accumulated actual usage time with respect to each of the electric current ranges. Consequently, a deterioration can be more accurately estimated. The accumulated actual usage time represents a value obtained by accumulating a time (actual usage time) in which the electric current actually flows to the OLED in the OLED lighting device. For instance, the accumulated actual usage time represents a value obtained by accumulating a usage time in the continuous application driving, or a value obtained by multiplying a pulse width (pulse duration) by a cumulative pulse number in the pulse application driving.

The OLED driving system according to another aspect further includes a luminance calculator which calculates a luminance value of the OLED lighting device corresponding to the usage information stored in the usage information storage part with respect to each of the electric current ranges by using correlation information representing a correlation between the electric current value and the accumulated actual usage time of the OLED lighting device, and a corresponding luminance value of the OLED lighting device.

The OLED driving system including the luminance calculator can calculate a luminance value of the OLED lighting device corresponding to the usage information stored in the usage information storage part with respect to each of the electric current ranges, and evaluate (recognize) a degree of deterioration of the OLED at the calculated luminance value. The lifetime of the OLED lighting device can be evaluated from the calculated luminance value.

The OLED driving system according to further another aspect includes: a prospection acquisition part which acquires a prospective accumulated actual usage time of the OLED lighting device with respect to each of the current ranges; and a luminance estimator which obtains, based on the prospective accumulated actual usage time acquired by the prospection acquisition part with respect to each of the electric current ranges, prospective usage information corresponding to the usage information with respect to each of the electric current ranges, and estimates, by using correlation information representing a correlation between the electric current value and the accumulated actual usage time of the OLED lighting device, and a corresponding luminance value of the OLED lighting device, a luminance value of the OLED lighting device corresponding to the usage information stored in the usage information storage part with respect to each of the electric current ranges and corresponding to the obtained prospective usage information with respect to each of the electric current ranges.

The OLED driving system further including the prospection acquisition part and the luminance estimator can estimate a luminance value after the prospective accumulated actual usage time, and evaluate (recognize) a degree of deterioration of the OLED at the estimated luminance value at that time. The lifetime of the OLED lighting device can be evaluated from the estimated luminance value.

The OLED driving system according to still another aspect includes: a second prospection acquisition part which acquires a prospective electric current value; and a lifetime estimator which obtains, based on an available actual usage time representing an actual time until a lifetime luminance value defined as a lifetime of the OLED lighting device and the prospective electric current value acquired by the second prospection acquisition part, lifetime usage information corresponding to the usage information with respect to each of the electric current ranges, and calculates the available actual usage time based on the lifetime luminance value, the usage information stored in the usage information storage part with respect to each of the electric current ranges, and the lifetime usage information obtained with respect to each of the electric current ranges, by using correlation information representing a correlation between the electric current value and the accumulated actual usage time of the OLED lighting device, and a corresponding luminance value of the OLED lighting device.

The OLED driving system including the second prospection acquisition part and the lifetime estimator can evaluate the available actual usage time (including a remaining available actual usage time of the lifetime, an available actual usage time in the continuous application driving, and a time obtained by multiplying a pulse width by a pulse number in the pulse application driving) when using the OLED lighting device at the prospective electric current value acquired by the second prospection acquisition part.

In the OLED driving system according to still further another aspect, the correlation information includes: first information representing a first correlation between an electric current value and an accumulated actual usage time of the OLED lighting device, and a luminance value of the OLED lighting device when driving the OLED lighting device by applying an electric current to the OLED lighting device at a rated electric current value or lower; and second information representing a second correlation between an electric current value and an accumulated actual usage time of the OLED lighting device, and a luminance value of the OLED lighting device when driving the OLED lighting device by applying an electric current to the OLED lighting device at a value higher than the rated electric current value.

The inventor has obtained the knowledge that a degree of damage to the OLED in applying the electric current at the rated electric current value or lower differs from that in applying the electric current at the value higher than the rated electric current value. According to the OLED driving system, the correlation information includes: the first information in applying an electric current at the rated electric current value or lower; and the second information in applying an electric current at a value higher than the rated electric current value, and hence it is possible to estimate a deterioration more accurately.

The OLED driving system according to further another aspect further includes a temperature acquisition part which acquires a usage temperature of the OLED lighting device. The usage information storage part stores usage information representing the accumulated actual usage time and the usage temperature of the OLED lighting device with respect to each of the electric current ranges different from one another. The usage information writer updates the accumulated actual usage time by adding the actual usage time calculated by the usage time arithmetic processor to the accumulated usage time stored in the usage information storage part and represented as the usage information with respect to the specific electric current range corresponding to the electric current value of the electric power output from the electric power output part, and causes the usage information storage part to store usage information representing the updated accumulated actual usage time and the usage temperature of the OLED lighting device acquired by the temperature acquisition part.

The OLED driving system including the temperature acquisition part to store the usage temperature as the usage information can estimate a deterioration in consideration of the usage temperature, and thus can more accurately estimate the deterioration.

An OLED driving method according to another aspect includes: a usage information storage step of storing usage information representing an accumulated actual usage time of an OLED lighting device in a usage information storage part with respect to each of a plurality of electric current ranges different from one another; an electric power output step of outputting an electric power at a changeable electric current value to drive the OLED lighting device at a predetermined target luminance; a usage time arithmetic processing step of calculating an actual usage time of the OLED lighting device; and a usage information writing step of updating the accumulated actual usage time by adding the actual usage time calculated in the usage time arithmetic processing step to the accumulated actual usage time stored in the usage information storage part and represented as the usage information with respect to a specific electric current range corresponding to the electric current value of the electric power output in the electric power output step, and causing the usage information storage part to store usage information representing the updated accumulated actual usage time.

The OLED driving method which includes storing the usage information representing the accumulated actual usage time of the OLED lighting device in the usage information storage part is capable of estimating a damage to the OLED based on the accumulated actual usage time with respect to each of the electric current ranges. Consequently, a deterioration can be more accurately estimated.

This application is based on Japanese Patent Application No. 2018-201446 filed in Japan Patent Office on Oct. 26, 2018, the entire disclosure of which are hereby incorporated by reference.

Although the present invention has been fully described by way of example with reference to the accompanying drawings, it is to be understood that various changes and/or modified embodiments will be apparent to those skilled in the art. Therefore, unless otherwise such changes and modified embodiments to be made by those skilled in the art depart from the scope of the present invention hereinafter defined, they should be construed as being included therein.

INDUSTRIAL APPLICABILITY

The present invention can provide an OLED driving system and an OLED driving method for driving an OLED lighting device.

The invention claimed is:

1. An OLED driving system comprising:
a usage information storage part which stores usage information representing an accumulated actual usage time of an OLED lighting device with respect to each of a plurality of electric current ranges different from one another;
an electric power output part which outputs an electric power at a changeable electric current value to drive the OLED lighting device at a predetermined target luminance;
a usage time arithmetic processor which calculates an actual usage time of the OLED lighting device;
a usage information writer which updates the accumulated actual usage time by adding the actual usage time calculated by the usage time arithmetic processor to the accumulated actual usage time stored in the usage information storage part and represented as the usage information with respect to a specific electric current range corresponding to the electric current value of the electric power output from the electric power output part, and causes the usage information storage part to store usage information representing the updated accumulated actual usage time;
a second prospection acquisition part which acquires a prospective electric current value; and
a lifetime estimator which obtains, based on an available actual usage time representing an actual time until a lifetime luminance value defined as a lifetime of the OLED lighting device and the prospective electric current value acquired by the second prospection acquisition part, lifetime usage information corresponding to the usage information with respect to each of the electric current ranges, and calculates the available actual usage time based on the lifetime luminance value, the usage information stored in the usage information storage part with respect to each of the electric current ranges, and the lifetime usage information obtained with respect to each of the electric current ranges, by using correlation information representing a correlation between the electric current value and the accumulated actual usage time of the OLED lighting device, and a corresponding luminance value of the OLED lighting device.

2. The OLED driving system according to claim 1, further comprising:
a luminance calculator which calculates a luminance value of the OLED lighting device corresponding to the usage information stored in the usage information storage part with respect to each of the electric current ranges by using the correlation information.

3. The OLED driving system according to claim 1, further comprising:
a prospection acquisition part which acquires a prospective accumulated actual usage time of the OLED lighting device with respect to each of the current ranges; and a luminance estimator which obtains, based on the prospective accumulated actual usage time acquired by the prospection acquisition part with respect to each of the electric current ranges, prospective usage information corresponding to the usage information with respect to each of the electric current ranges, and estimates, by using the correlation information, a luminance value of the OLED lighting device corresponding to the usage information stored in the usage information storage part with respect to each of the electric current ranges and corresponding to the obtained prospective usage information with respect to each of the electric current ranges.

4. The OLED driving system according to claim 1, wherein the correlation information includes: first information representing a first correlation between an electric current value and an accumulated actual usage time of the OLED lighting device, and a luminance value of the OLED lighting device when driving the OLED lighting device by applying an electric current to the OLED lighting device at a rated electric current value or lower; and second information representing a second correlation between an electric current value and an accumulated actual usage time of the OLED lighting device, and a luminance value of the OLED lighting device when driving the OLED lighting device by applying an electric current to the OLED lighting device at a value higher than the rated electric current value.

5. The OLED driving system according to claim 1, further comprising:
a temperature acquisition part which acquires a usage temperature of the OLED lighting device, wherein
the usage information storage part stores usage information representing the accumulated actual usage time and the usage temperature of the OLED lighting device with respect to each of the electric current ranges different from one another, and
the usage information writer updates the accumulated actual usage time by adding the actual usage time calculated by the usage time arithmetic processor to the accumulated usage time stored in the usage information storage part and represented as the usage information with respect to the specific electric current range corresponding to the electric current value of the electric power output from the electric power output part, and causes the usage information storage part to store usage information representing the updated accumulated actual usage time and the usage temperature of the OLED lighting device acquired by the temperature acquisition part.

6. An OLED driving system comprising:
a usage information storage part which stores usage information representing an accumulated actual usage time of an OLED lighting device with respect to each of a plurality of electric current ranges different from one another;
an electric power output part which outputs an electric power at a changeable electric current value to drive the OLED lighting device at a predetermined target luminance;
a usage time arithmetic processor which calculates an actual usage time of the OLED lighting device;
a usage information writer which updates the accumulated actual usage time by adding the actual usage time calculated by the usage time arithmetic processor to the accumulated actual usage time stored in the usage information storage part and represented as the usage information with respect to a specific electric current range corresponding to the electric current value of the electric power output from the electric power output part, and causes the usage information storage part to store usage information representing the updated accumulated actual usage time; and
a luminance calculator which calculates a luminance value of the OLED lighting device corresponding to the usage information stored in the usage information storage part with respect to each of the electric current ranges by using correlation information representing a correlation between the electric current value and the accumulated actual usage time of the OLED lighting device, and a corresponding luminance value of the OLED lighting device, wherein the correlation information includes: first information representing a first correlation between an electric current value and an accumulated actual usage time of the OLED lighting device, and a luminance value of the OLED lighting device when driving the OLED lighting device by applying an electric current to the OLED lighting device at a rated electric current value or lower; and second information representing a second correlation between an electric current value and an accumulated actual usage time of the OLED lighting device, and a luminance value of the OLED lighting device when driving the OLED lighting device by applying an electric current to the OLED lighting device at a value higher than the rated electric current value.

7. The OLED driving system according to claim 6, further comprising:
a prospection acquisition part which acquires a prospective accumulated actual usage time of the OLED lighting device with respect to each of the current ranges; and
a luminance estimator which obtains, based on the prospective accumulated actual usage time acquired by the prospection acquisition part with respect to each of the electric current ranges, prospective usage information corresponding to the usage information with respect to each of the electric current ranges, and estimates, by using the correlation information, a luminance value of the OLED lighting device corresponding to the usage information stored in the usage information storage part with respect to each of the electric current ranges and corresponding to the obtained prospective usage information with respect to each of the electric current ranges.

8. The OLED driving system according to claim 6, further comprising:
a second prospection acquisition part which acquires a prospective electric current value; and
a lifetime estimator which obtains, based on an available actual usage time representing an actual time until a lifetime luminance value defined as a lifetime of the OLED lighting device and the prospective electric current value acquired by the second prospection acquisition part, lifetime usage information corresponding to the usage information with respect to each of the electric current ranges, and calculates the available actual usage time based on the lifetime luminance value, the usage information stored in the usage information storage part with respect to each of the electric current ranges, and the lifetime usage information obtained with respect to each of the electric current ranges, by using the correlation information.

9. The OLED driving system according to claim 6, further comprising:

a temperature acquisition part which acquires a usage temperature of the OLED lighting device, wherein the usage information storage part stores usage information representing the accumulated actual usage time and the usage temperature of the OLED lighting device with respect to each of the electric current ranges different from one another, and the usage information writer updates the accumulated actual usage time by adding the actual usage time calculated by the usage time arithmetic processor to the accumulated usage time stored in the usage information storage part and represented as the usage information with respect to the specific electric current range corresponding to the electric current value of the electric power output from the electric power output part, and causes the usage information storage part to store usage information representing the updated accumulated actual usage time and the usage temperature of the OLED lighting device acquired by the temperature acquisition part.

10. An OLED driving system comprising:

a usage information storage part which stores usage information representing an accumulated actual usage time of an OLED lighting device with respect to each of a plurality of electric current ranges different from one another;

an electric power output part which outputs an electric power at a changeable electric current value to drive the OLED lighting device at a predetermined target luminance;

a usage time arithmetic processor which calculates an actual usage time of the OLED lighting device; and a usage information writer which updates the accumulated actual usage time by adding the actual usage time calculated by the usage time arithmetic processor to the accumulated actual usage time stored in the usage information storage part and represented as the usage information with respect to a specific electric current range corresponding to the electric current value of the electric power output from the electric power output part, and causes the usage information storage part to store usage information representing the updated accumulated actual usage time, wherein the plurality of electric current ranges include at least a range of not higher than a rated electric current value of the OLED lighting device and a range of higher than the rated electric current value.

11. The OLED driving system according to claim 10, further comprising:

a luminance calculator which calculates a luminance value of the OLED lighting device corresponding to the usage information stored in the usage information storage part with respect to each of the electric current ranges by using correlation information representing a correlation between the electric current value and the accumulated actual usage time of the OLED lighting device, and a corresponding luminance value of the OLED lighting device, wherein the correlation information includes: first information representing a first correlation between an electric current value and an accumulated actual usage time of the OLED lighting device, and a luminance value of the OLED lighting device when driving the OLED lighting device by applying an electric current to the OLED lighting device at a rated electric current value or lower; and second information representing a second correlation between an electric current value and an accumulated actual usage time of the OLED lighting device, and a luminance value of the OLED lighting device when driving the OLED lighting device by applying an electric current to the OLED lighting device at a value higher than the rated electric current value.

12. The OLED driving system according to claim 10, further comprising:

a prospection acquisition part which acquires a prospective accumulated actual usage time of the OLED lighting device with respect to each of the current ranges; and a luminance estimator which obtains, based on the prospective accumulated actual usage time acquired by the prospection acquisition part with respect to each of the electric current ranges, prospective usage information corresponding to the usage information with respect to each of the electric current ranges, and estimates, by using correlation information representing a correlation between the electric current value and the accumulated actual usage time of the OLED lighting device, and a corresponding luminance value of the OLED lighting device, a luminance value of the OLED lighting device corresponding to the usage information stored in the usage information storage part with respect to each of the electric current ranges and corresponding to the obtained prospective usage information with respect to each of the electric current ranges.

13. The OLED driving system according to claim 10, further comprising:

a second prospection acquisition part which acquires a prospective electric current value; and a lifetime estimator which obtains, based on an available actual usage time representing an actual time until a lifetime luminance value defined as a lifetime of the OLED lighting device and the prospective electric current value acquired by the second prospection acquisition part, lifetime usage information corresponding to the usage information with respect to each of the electric current ranges, and calculates the available actual usage time based on the lifetime luminance value, the usage information stored in the usage information storage part with respect to each of the electric current ranges, and the lifetime usage information obtained with respect to each of the electric current ranges, by using correlation information representing a correlation between the electric current value and the accumulated actual usage time of the OLED lighting device, and a corresponding luminance value of the OLED lighting device.

14. The OLED driving system according to claim 10, further comprising:

a temperature acquisition part which acquires a usage temperature of the OLED lighting device, wherein the usage information storage part stores usage information representing the accumulated actual usage time and the usage temperature of the OLED lighting device with respect to each of the electric current ranges different from one another, and the usage information writer updates the accumulated actual usage time by adding the actual usage time calculated by the usage time arithmetic processor to the accumulated usage time stored in the usage information storage part and represented as the usage information with respect to the specific electric current range corresponding to the electric current value of the electric power output from the electric power output part, and causes the usage information storage part to store usage information representing the updated accumulated actual usage time and the usage temperature of the OLED lighting device acquired by the temperature acquisition part.

\* \* \* \* \*